United States Patent [19]

Walmann

[11] 4,018,126

[45] Apr. 19, 1977

[54] TONE GENERATION AND MODIFICATION APPARATUS

[76] Inventor: Brian I. Walmann, 6823 N. Michigan, Kansas City, Mo. 64118

[22] Filed: Mar. 26, 1975

[21] Appl. No.: 562,357

[52] U.S. Cl. .................................. 84/1.24; 84/1.13; 84/1.25; 84/DIG. 9; 333/70 CR

[51] Int. Cl.² ...................... G10H 1/02; G10H 3/00; G10H 1/04; H03H 7/10

[58] Field of Search ................. 84/1.01, 1.03, 1.13, 84/1.24, DIG. 9, 125; 333/70 R, 70 CR

[56] References Cited

UNITED STATES PATENTS

| | | | |
|---|---|---|---|
| 2,139,023 | 12/1938 | Kock | 84/DIG. 9 |
| 2,694,954 | 11/1954 | Kock | 84/DIG. 9 |
| 3,453,553 | 7/1969 | Van Overbeek et al. | 333/70 R |
| 3,475,623 | 10/1969 | Moog | 333/70 R |
| 3,742,391 | 6/1973 | Smith | 333/70 CR |
| 3,787,601 | 1/1974 | Campbell | 84/1.03 |
| 3,897,709 | 8/1975 | Hiyoshi | 84/1.24 |
| 3,911,776 | 10/1975 | Beigel | 84/DIG. 9 |

*Primary Examiner*—E. S. Jackmon
*Attorney, Agent, or Firm*—Schmidt, Johnson, Hovey & Williams

[57] ABSTRACT

Apparatus is provided for use in electronically creating music or special sound effects through the generation and modification of audio frequency, electrical, tone sequence signals. The apparatus is characterized by its ability to generate random, as well as cyclically patterned, tone sequences; by the degree of control provided over both basic parameters of generation and a number of available special modifying effects; and by the reliability of the apparatus and the relative economy with which it may be maufactured. The preferred form of apparatus employs functional stages or modules largely implemented with solid state components. Among the novel functional modules utilized in the apparatus is an improved type of low pass, electronic R-C ladder filter employing diodes and fixed value capacitances, rather than transistors or/and variable value capacitances.

29 Claims, 3 Drawing Figures

TONE GENERATION AND MODIFICATION APPARATUS

This invention relates to improved apparatus for electronically creating music or special sound effects and, more particularly, to such apparatus for generating and modifying audio tone signals and patterns thereof in a controlably selective manner.

In recent years, there has been an increasing appreciation of the potential aesthetic appeal of music or sound effects producible by electronic means. However, such potential has not been fully realized due to the inherent limitations and disadvantages of the types of equipment that have heretofore been available for such purpose. Prior devices intended or attempted to be adapted for use in such application have generally either been so crude, unreliable and harsh in the result produced as to be commercially unacceptable or so complex and expensive as to be economically impractical for common use. Even the more elaborate of the earlier efforts, however, have failed to provide that choice of combinable effects and versatility and to attain that degree of selective control over variable parameters of pitch, tempo, patterns and the like which are needed to fully achieve the pleasant and melodic results of which this type of device is, perhaps uniquely, capable.

Accordingly, it is the primary object of this invention to provide improved apparatus for the generation and modification of tones and tone patterns, which overcomes the common limitations and disadvantages of prior devices proposed for the same general purpose.

It is another important object of the invention to provide such apparatus which, in addition to offering selective control over an unusually wide choice of compatibly combinable effects rendering it possible to produce heretofore unavailable melodic patterns, does so by emans of relatively simple circuitry that is not only highly reliable but also relatively inexpensive and, therefore, practical for ordinary commercial usage.

Other more detailed, though also important, objects of the invention will be clear or become apparent to those skilled in the art from the nature, illustration and description of the currently preferred embodiment of the invention being disclosed herein.

Figure 1:
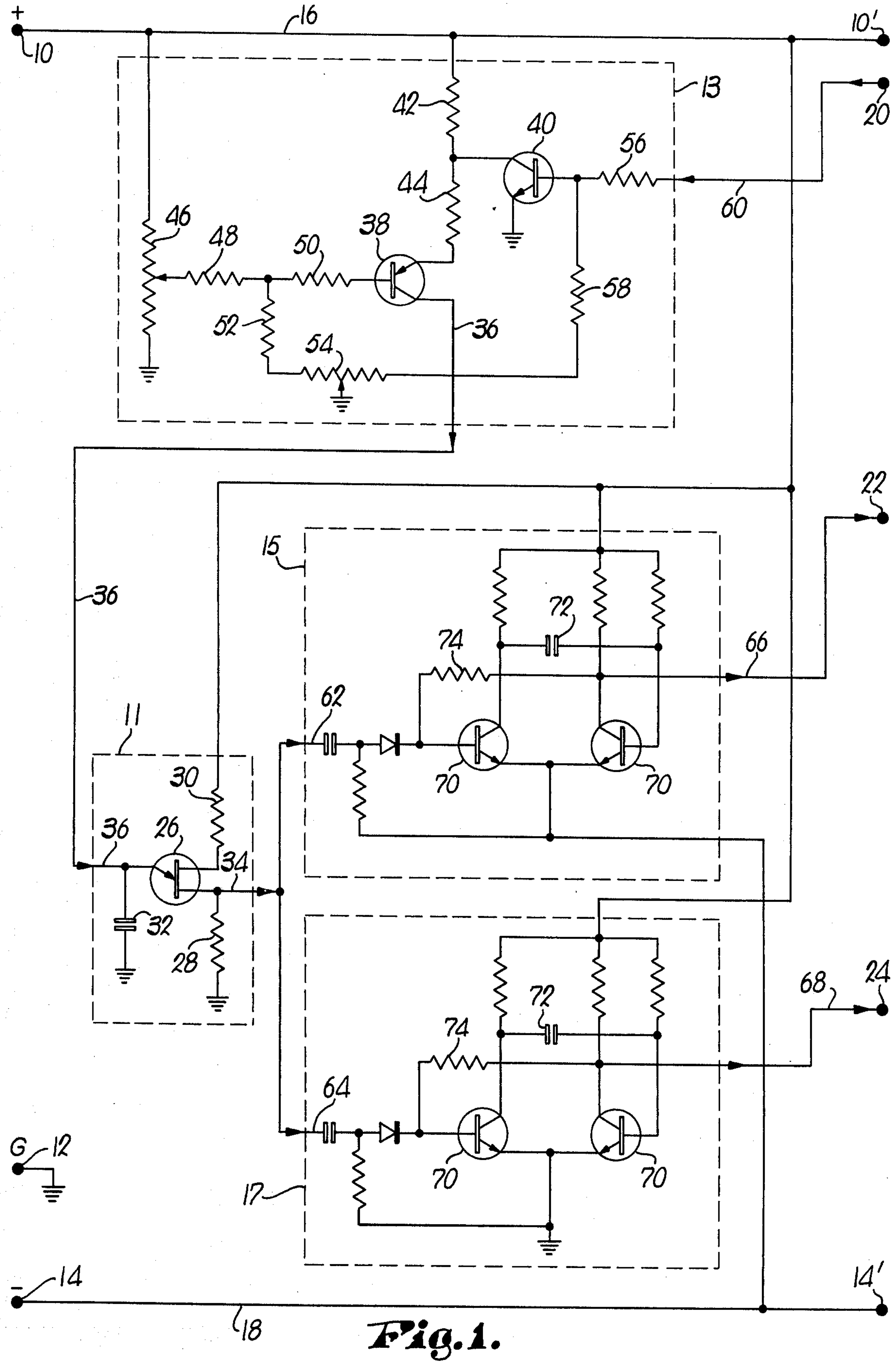
Figure 2:
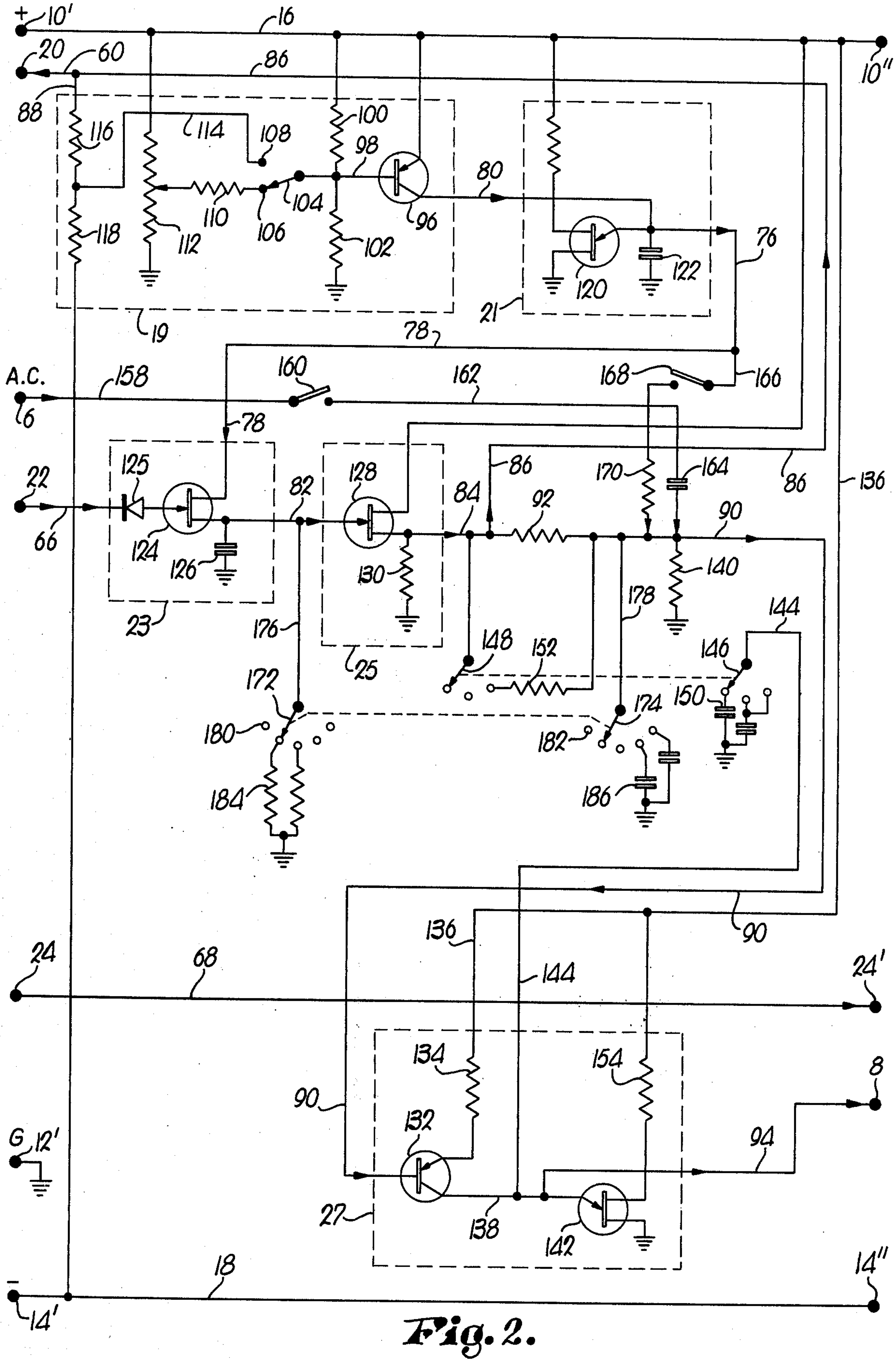
Figure 3:
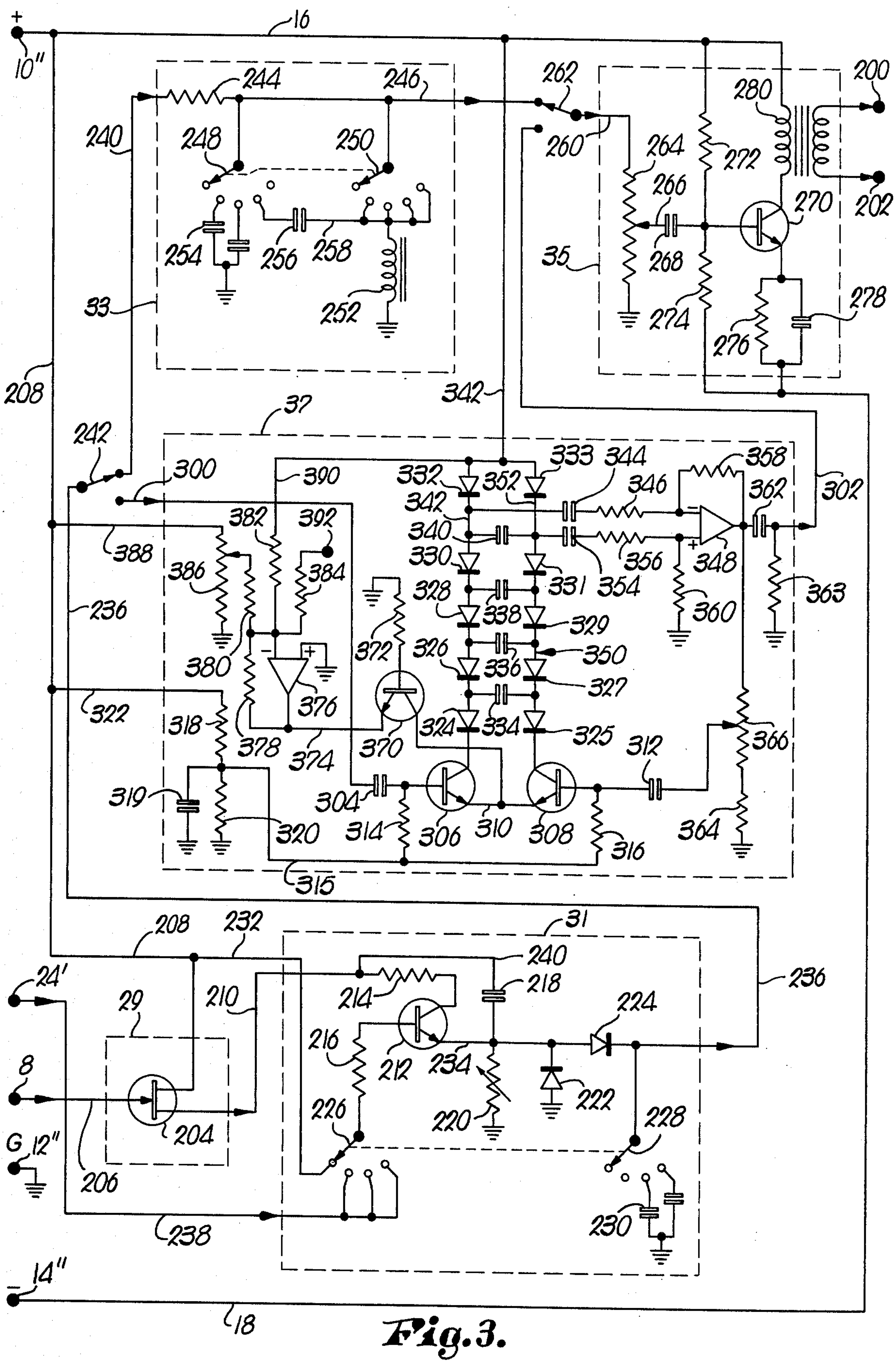

In the accompanying drawings:

FIGS. 1, 2 and 3, taken together, are a schematic diagram of the preferred embodiment of the invention chosen to illustrate the principles and practices of the invention and to serve as a basis for more specific explanation thereof.

Although the preferred embodiment employs discreet component, transistorized circuitry, those skilled in the art will understand that integrated circuitry, different transistor types or even a vacuum tube implementation could be equivalently used in the practice of the invention. Similarly, since (with the exception of a novel dynamic filtering module hereinafter noted) the individual functional stages or modules are per se essentially conventional, it will be understood that the appropriate values for impedence components will generally depend upon, vary, and be selected in manner within the skill of the art for each embodiment of a given stage or module in accordance with the particular choice of active elements and supply voltages to be used.

Briefly summarized, the invention employs a novel combination of functional stages or modules, with novel relationships therebetween, to produce the novel results which the apparatus achieves. In the embodiment illustrated, the portion of the apparatus shown in FIG. 1 and all but the lower part of FIG. 2 is primarily concerned with the control of tempo, pattern and timing effects, including provision for choice between regular tone sequences in which successive tones occur at uniform intervals of an adjustable basic tone repetition rate, tone grouping patterns in which successive groups of tones recur at uniform intervals of an adjustable pattern repetition rate but with the individual tones of each group occurring in a controllable regular pattern involving non-uniform intervals between particular tones within each group, or irregular tone occurrence sequences characterized by the presence of a selectable degree of randomness of tempo of successive tones relative to an adjustable basic or reference repetition rate, to permit regular, patterned, random or mixed tempos; the portion of the apparatus shown in the lower part of FIG. 2 is primarily concerned with tone generation, the selective control of available modulation effects, and the selective control of tone pitch, "slurring" and other special effects; and the portion of the apparatus shown in FIG. 3 is primarily concerned with selective control or modification of the tonal characteristics of the generated audio patterns by means of harmonic shifting and filtering, together with necessary amplification and controlled output of the final audio signals. The nature, purpose and functions of the various stages or modules of the apparatus, and the important relationships therebetween, can more readily be perceived from specific reference to the drawings in the light of the descriptions that follow.

Commencing with FIG. 1, the terminals 10, 12 and 14 respectively represent positive, neutral ground and negative connections with a conventional direct current power supply (not specifically shown), which preferably includes a reasonable degree of filtering to minimize ripple if power is derived by rectification from an alternating current source. Positive and negative power leads 16 and 18 are respectively coupled with terminals 10 and 14 and extend via points 10' and 10'' and points 14' and 14'' to the other figures of the drawings wherein they are similarly numbered. The neutral terminal 12 and its counterparts 12' and 12'' in the other figures represent a common or "chassis" ground, to which connections throughout the apparatus are indicated by the usual symbol. In the preferred embodiment, a conventional direct current power supply with outputs of +9 volts and −9 volts with respect to a neutral ground has been found quite satisfactory.

The stages or modules illustrated in FIG. 1 are a current controlled, pulse generating, clock oscillator unit 11, a voltage controlled current source unit 13 coupled with the oscillator 11 for controlling the latter in manner hereinafter described, and a pair of monostable or "one-shot" multivibrator units 15 and 17 coupled with a controlled by the output from the oscillator 11. It is noted that, to facilitate following the circuitry between the figures into which it was necessarily divided in the drawings and also between stages or modules in the same figure, the functional directions of primarily signal and control paths are indicated adjacent the appropriate inter-figure points and dotted-line boxes delineating the various stages or modules in the drawings. It will immediately be perceived from FIG. 1, therefore, both that some sort of "feedback" signal (hereinafter further referred to) is being delivered to the current source 13 from the portion of the apparatus in FIG. 2 via point 20, and that the significant outputs from the portion of the apparatus shown in FIG. 1 are signals respectively delivered to points 22 and 24 from the multivibrators 15 and 17.

The oscillator unit 11 employs a unijunction transistor 26 (typically a type 2N4871 or equivalent) with a grounded load resistance 28 connected to the output base, a resistance 30 coupling the other base to the positive voltage supply, and, more significantly, a grounded capacitance 32 coupled to the emitter, to function as a relaxation oscillator for producing a sequence of positive "clock" pulses at the output base lead 34, the repetition rate of which pulses is controlled by the current applied to the capacitance 32 from the current source 13 as hereinafter described. The individual pulses of the output at base lead 34 are preferably quite sharp or spike-like, and a rise thereof from essentially ground potential to approximately +3 volts is typical and satisfactory for triggering the multivibrators 15 and 17. Control of the repetition rate of the pulses in the output signal from the oscillator 11 by the current derived from the current source 13 is accomplished by virtue of the fact that the magnitude of such current controls the rate of charging of the emitter capacitance 32. With current applied thereto, the capacitance 32 charges until it has become sufficiently charged to apply to the emitter a positive voltage of sufficiently high level to cause the transistor 26 to freely conduct between its emitter and output base, whereupon discharge of the capacitance 32 through the conducting transistor 26 ("relaxation") produces an output pulse at the base lead 34; this is then followed by an interval, determined by the magnitude of the current applied to the capacitance 32, until the latter can again charge sufficiently to again "fire" the transistor 26 and thereby produce the next output pulse from the latter. Thus, the repetition rate of the pulses being output from the unit 11 is controllably variable in correspondence with the current applied to the capacitance 32; however, it may be noted that the normal range within which such pulse rate is controllably held should be such as to establish the normal intervals between the pulses at an order of time consistent with the limitations of listeners to perceive or enjoy changes in the audio effects being produced (i.e., from about .01 second to perhaps a few seconds). Thus, it will be understood that the repetition rate of the pulses in the output from unit 11, being ultimately employed for controlling the basic or reference tempo for the initiation of successive tones, is relatively slower than the frequencies of operation or times required for change of state functioning of other stages or modules of the apparatus that are concerned with controlling the pitch or other characteristics of the particular tones being successively produced at the selected tempo.

Although the specific advantages of employing a clock oscillator unit 11 whose variable repetition rate is controlled by an electrical magnitude will become more clear hereinafter, it should already be apparent that the nature of the unit 11 lays the groundwork for controlling the basic reference for the tempo or timing aspect of the functioning of the apparatus both by electrical means and in a manner that is not only convenient and reliable but also extremely versatile with respect to the types of electrical signals or parameters otherwise available within such apparatus to which such variable clock may be caused to respond (i.e. fixed, adjustable or even varying types of control or signal magnitudes). Moreover, it may also be observed that controlling the repetition rate of the oscillator 11 with a current (rather than a voltage) magnitude, together with the timeoriented charging characteristics of the capacitance 32, presuming that provision when needed of other means in the apparatus for converting voltage waveforms to current magnitudes (as is done in the current source 13, as hereinafter explained), permits tempo and timing control in the apparatus to be keyed not just to an instantaneous voltage level of an electrical signal but rather, or also, to the cumulating effects with the passage of time of even signals of varying or patterned waveform magnitude, as is desirable to achieve certain of the versatile results accomplished by the apparatus in an economical and reliable fashion.

Turning attention next to the current source unit 13 of FIG. 1, it will be noted that such module employs a pair of active elements in the form of a PNP transistor 38 (typically a type 2N5138 or equivalent) and an NPN transistor 40 (typically a type TIS97 or equivalent). Focusing first on the portion of unit 13 involving the transistor element 38 and its associated circuitry, it will be apparent that, when the transistor 38 is conductive, a path for the flow of charging current to the capacitance 32 of unit 11 is provided from the positive power lead 16, through a pair (the significance of which is noted hereinafter) of series emitter resistances 42 and 44 associated with the power to emitter connection for the transistor 38, through the internal emitter to collector structure of the transistor 38 (when conducting), and via the lead 36 to the capacitance 32. The ability to control the conductance and current flow through the internal emitter to collector structure of the transistor 38 in accordance with the level of a positive (but negative relative to the emitter) potential applied to its base (as well as by a second means hereinafter discussed in connection with the transistor 40) ideally adapts the transistor 38 for functioning of the unit 13 as a voltage controlled current source (or electronic "valve"), by which the flow of current from the collector of the transistor 38 to the capacitor 32 of the oscillator unit 11 may be regulated on a continuing basis and in correlation with the level of a control voltage applied to the base of the transistor 38 (as well as in further correlation with a second voltage waveform signal coupled with the emitter of the transistor 38 by means of the transistor 40, as hereinafter explained).

The first control applied to the transistor 38, referred to as the basic or reference tempo control and which determines the basic length of the intervals between initiation of the successive tones of all tone sequences generated by the apparatus (which may be altered by other means hereinafter described), is implemented in the preferred embodiment as a manually adjustable voltage control accessible to the user by means of a potentiometer 46 coupled between the positive power lead 16 and ground, the variable tap of which is coupled through a pair of series resistances 48 and 50 with the base of the transistor 38. The connection point between resistances 48 and 50 is resistance coupled to ground through a resistance 52 and the portion of a potentiometer 54 between the end thereof adjacent the resistance 52 and the grounded variable tap thereof. Ignoring for the moment the adjustable nature and purpose of the second potentiometer 54, and assuming any given setting of the tap thereof, it will be clear that manual adjustment of the tap of the tempo control potentiometer 46 (which acts as a voltage divider between the positive power lead 16 and ground) determines the level of positive voltage applied to the top of what in effect is a second voltage divider including the resistances 48 and 52 and the portion of the second potentiometer between the end thereof adjacent the resistance 52 and the grounded tap thereof. Since the base of transistor 38 is, by means of the coupling resistance 50, "tapped" into such second voltage divider between resistance 48 and 52, it will be clear that, for any given setting of the tap of the second potentiometer 54, the position to which the tap of the tempo control potentiometer 46 is adjusted determines the level of positive voltage applied to the base of the transistor 38, which in turn inversely controls the emitter to collector conductivity of the transistor 38 and thereby the magnitude of flow of charging current to the capacitance 32 of unit 11 from the collector of the transistor 38. Thus, the manually adjustable tempo control potentiometer 46 provides one means of exerting selective control over the repetition rate of the sequenced pulses generated at the output lead 34 of the oscillator unit 11, with the "tempo" or repetition rate of such pulses being increased as the tap of potentiometer 46 is adjusted toward the end thereof nearest the grounded end thereof.

The second control applied to the transistor 38, referred to as the random timing or pttern feedback influence control and which adjustably determines the relative degree of influence upon the charging current supplied to the capacitance 32 of oscillator 11 from the current source unit 13 that is exerted respectively by the manual basic tempo control potentiometer 46 and a random or patterned, stepped feedback voltage signal produced in manner hereinafter described and fed to the unit 13 via the point 20, is also implemented for manual adjustment by means of the feedback influence control potentiometer 54 and the other circuitry associated with the transistor 40. The point 20, which on FIG. 1 represents the source of the mentioned random or patterned feedback voltage, is coupled with the base of transistor 40 through a coupling resistance 56; the collector of transistor 40 is coupled to the power-to-emitter circuit for the transistor 38 between the pair of resistances 42 and 44 thereof; the emitter of transistor 40 is grounded; and the end of the feedback influence control potentiometer 54 opposite the resistance 52 is also coupled to the base of the transistor 40 through a resistance 58.

As will be clear, the resistance 42 and the internal collector to emitter resistance of the transistor 40 essentially presents a voltage divider between the positive power lead 16 and ground, from an intermediate "tap" of which (at the connection point of the resistance 42 and the collector of the transistor 40) the positive voltage for the emitter of the transistor 38 (and thereby the charging current to be delivered to the capacitor 32 of the oscillator 11 from the collector of transistor 38) is derived through the resistance 44 coupled to the emitter of the transistor 38. When the transistor 40 is not internally conductive between its collector and its emitter, the effect of the high internal resistance of the collector to emitter structure of the transistor 40 upon the mentioned emitter powering circuit for the transistor 38 is negligible, and the amount of current flow delivered from its collector for charging the capacitance 32 is essentially dependent upon the setting of the basic tempo control potentiometer 46; however, if and as the internal conductivity of the transistor 40 between its collector and emitter is caused to increase, and its internal collector to emitter resistance thereby decreased, the level of the positive voltage delivered to the emitter of the transistor 38 from the "tap" of the "voltage divider" 42-40 via the resistance 44 is decreased, with a corresponding reduction in the flow of charging current from the collector of transistor 38 to the capacitance 32 for any given setting of the basic tempo control potentiometer 46. Another way to look at this last-mentioned action is that the internal resistance of the collector to emitter structure of the transistor 40, which is dependent upon the state of conductivity of the transistor 40, is essentially coupled in "shunt" relationship to the series combination of the resistance 44, the internal emitter to collector structure of the transistor 38, the lead 36 and the capacitance 32 itself.

The internal conductivity of the transistor 40 between its energized collector and its emitter is, of course, determined mainly be the potential applied to its base, which serves as its primary control element in the circuit configuration being employed. Accordingly, the state of conductivity of the transistor 40, with its mentioned influence upon the conductivity of the transistor 38 (and thereby the level of charging current flowing to the capacitance 32), is adapted to respond to and be controlled by a signal voltage "fed back" to the base of the transistor 40 via the point 20, the feed back lead 60 and the resistance 56, which signal is hereinafter more fully described.

The extents to which the amount of charging current flowing to the capacitor 32 through the internal emitter to collector structure of the transistor 38 are determined respectively by the feed back voltage from point 20 and the setting of the basic tempo control potentiometer 46, are controlled by the variable resistance coupling of the base of the transistor 40 to ground through the resistance 58 and the part of the feedback influence control potentiometer 54 between the grounded tap thereof and the end thereof adjacent the resistance 58. As the grounded tap of the potentiometer 54 is moved toward the end thereof adjacent the resistance 58, the total amount of resistance separating the base of the transistor 40 from ground is eventually decreased to approximately the value of the resistance 58, which value is preferably so chosen in the light of the particular type of transistor 40 to be employed that, with the tap of potentiometer 54 so adjusted, the transistor 40 will remain in an essentially non-conductive state and unresponsive to any feed back signal coming from point 20; under such conditions, the "tempo" is controlled entirely by the manual setting of the tap of the potentiometer 46. As the tap of the potentiometer 54 is moved toward the end thereof adjacent resistance 52, however, the total resistance interposed between the base of the transistor 40 and ground is selectively increased until the transistor 40 is rendered able to respond in increasing degree to a feed back signal voltage applied to its emitter; under such conditions, the manual setting of the tap of the feedback influence control potentiometer 54 determines the extent to which the feed back signal voltage from point 20 can jointly influence or even dominate the control otherwise being exerted by the setting of the basic tempo control poentiometer 46 over the amount of charging current flowing from the transistor 38 to the capacitor 32 of unit 11, and thereby the repetition rate of the pulses produced at the output lead 34 of the oscillator unit 11.

It will be noted that the ground provided by the tap of the feedback influence control potentiometer 54 is common to the base circuits for both of the transistors 38 and 40, and that portions of the resistance element of the potentiometer 54 on opposite sides of its tap are respectively interposed in such circuits, although of variable resistances in each circuit depending upon the position of the tap. This is significant for the reason that, as the transistor 40 is permitted to increasingly respond to the feed back signal from point 20 and to become increasingly conductive, such action, by lowering the positive potential applied to the emitter of the transistor 38 tends to decrease the average level of flow of charging current through the emitter to collector structure of the transistor 38 to the capacitor 32 for any given setting of the tap of the tempo control potentiometer 46. That effect increasingly occurs as the tap of the feedback influence control potentiometer 54 is moved toward the end thereof adjacent resistance 52. The mutuality of the potentiometer 54 and its tap to the base circuits of both of the transistors 38 and 40, however, renders the potentiometer 54 self-compensating with respect to the effect noted. Such automatic compensation is accomplished through the fact that, as the tap of potentiometer 54 is moved toward the end thereof adjacent resistance 52, the resistance of the "lower end" of the above mentioned "second voltage divider" 48, 52-54 is decreased to lower the potential applied to the base of the transistor 38 through the resistance 50 for any given setting of the tap of the potentiometer 46 (which, since transistor 38 is a PNP type, increases the current flow through the internal emitter to collector structure of the transistor 38 in manner to offset the decreased current flow therethrough that would otherwise result from the increased conductivity of the transistor 40 in response to feed back signals from the point 20).

Thus, the tempo control potentiometer 46 permits manual adjustment of a basic pulse repetition rate for the output on lead 34 of the oscillator unit 11, which may serve as the sole determiner of such tempo or repetition rate when the tap of the random timing control potentiometer 54 is fully moved toward the resistance 58, or such basic rate may be influenced in increasing amounts or essentially supplanted by the response of the transistor 40 to the feed back signal from the point 20 when the tap of the feedback influence control potentiometer 54 is manually adjusted toward the resistance 52.

The multivibrators 15 and 17 have their input leads 62 and 64 respectively coupled to the output lead 34 from the oscillator unit 11 so as to both be triggered by the pulses from the latter at whatever repetition rate is established therefor by the units 11 and 13, as previously explained. The multivibrator units 15 and 17 are, however, of the monostable or one-shot type and merely serve to produce at their respective output leads 66 and 68 trains of essentially square-wave pulses of duration different for the unit 15 than for the unit 17, but with such square-wave pulses still being initiated in the outputs from both of the units 15 and 17 at the same repetition rate corresponding to the triggering pulse output from the unit 11. Thus, for each triggering pulse from the oscillator unit 11, each of the multivibrator units 15 and 17 produces a corresponding square-wave pulse. The internal construction and functioning of the multivibrators 15 and 17 is so conventional and familiar to those skilled in the art in even a textbook sense that it should suffice primarily just to note that each of the units 15 and 17 employs a pair of transistors 70 (which may be, for instance, of type 2N5129), RC timing constant determining impedances 72 and 74 and other conventional components and relationships. It may be observed that, while the emitters of the transistors 70 in the unit 17 are grounded (which provides in the preferred embodiment output pulses rising from approximately ground level to about +9 volts), the positive to negative swing of the pulses desired in the output from the unit 15 (rising from approximately −9 volts to approximately +9 volts in the preferred embodiment) is accomplished by coupling the emitters of the transistor 70 in the unit 15 to the negative power lead 18. Although the pulse duration widths chosen for the outputs of units 15 and 17 are not critical, the preferred embodiment uses a choice of the time constant determining impedances 72 and 74 to provide an output pulse width from the unit 15 of approximately 50 microseconds in the pulse train delivered to point 22, while the unit 17 uses time constant determining components 72 and 74 to provide a width of approximately 25 milliseconds for the pulses delivered to the point 24. The utilization of these essentially squarewave pulse outputs delivered by the multivibrators 15 and 17 to points 22 and 24 in the functioning of the remainder of the apparatus will be explained as the descriptive progresses to the units shown in FIGS. 2 and 3, it being observed as a further prelude to that discussion, however, that the spacing or time intervals between the initiation of individual pulses in the outputs from each of the units 15 and 17 is substantially greater than the widths or time durations of any individual pulses therein, and that, although the widths of such individual pulses remain constant by virtue of the nature and functioning of the monostable vibrators by which they are produced, their repetition rates are subject to controlled change in correspondence with the repetition rate of the pulses in the triggering output from the oscillator unit 11.

Referring next to the portion of the apparatus illustrated in FIG. 2, the stages or modules of the preferred embodiment shown are a voltage controlled, current generator unit 19, a current controlled, sawtooth reference generator unit 21, an electronic switch or gate unit 23 which may also appropriately be referred to as a "sample and hold" unit in view of its memory-like function), a follower unit 25, and a voltage controlled, tone generator unit 27, together with various associated controls hereinafter identified. It will be understood that "points" 10′, 12′, 14′, 20, 22 and 24 in FIG. 2 merely represent connections with similarly identified points in FIG. 1. FIG. 2 also includes an additional power input terminal 6, to which one side of an oppositely grounded source of 60 cycle, low voltage, alternating current may be coupled.

For purposes of initial general orientation with respect to the stages or modules illustrated in FIG. 2, in their primary relationships to each other and the previously described modules shown in FIG. 1, it may be observed that the pulse train output from the multivibrator unit 15 of FIG. 1 is delivered via point 22 and lead 66 to the gate or sample and hold unit 23 as a gating control signal therefor; the input to be switched or gated (and "remembered") by the gate unit 23 is delivered thereto via leads 76 and 78 from output of the sawtooth reference generator unit 21, the frequency of such output from the generator unit 21 being controlled by a current level control signal delivered thereto via lead 80 from the voltage controlled, current generator unit 19; the output from the sample and hold unit 23 is delivered via lead 82 and through the follower unit 25 to three destinations, including to the point 20 via leads 84, 86 and 60 to provide the feedback control signal for the voltage controlled, current source unit 13 of FIG. 1, back via leads 84, 86 and 88 to a selectable control input of the voltage controlled current generator 19 of FIG. 2 used in the random timing mode of operation, and forwardly via leads 84 and 90 and a coupling resistance 92 to the primary control input of the voltage controlled tone generator unit 27; and the output from the tone generator unit 27 is delivered via lead 94 to the interfigure connection point 8, from which it is coupled with the portion of the apparatus shown in FIG. 3 as hereinafter described. Further interconnections in FIG. 2 and their purposes will be pointed out as the description proceeds, it being also noted that the pulse train output from the multivibrator unit 17 of FIG. 1 is not coupled with the portion of the apparatus shown in FIG. 2 and simply proceeds via lead 68 and points 24 and 24' from FIG. 1 to FIG. 3.

More detailed consideration of the stages or modules of the apparatus shown in FIG. 2 can probably best start with the voltage controlled, current generator unit 19, which, similarly to the portion of the unit 13 of FIG. 1 involving the transistor 38, is adapted to a current output of the flow level determined by the potential level of a voltage type control input. The unit employs a transistor 96 (which may be of a type 2N5138) having its emitter directly coupled to the positive power lead 16, its collector coupled to deliver to the lead 80 a current output of flow level dependent upon the internal conductance of the emitter to collector structure of the transistor 96 under various conditions of control, and its base adapted to serve as the primary control element and coupled via lead 98 with, first, the "center tap" of a bias-establishing voltage divider employing resistances 100 and 102 series connected between the positive power lead 16 and ground, and secondly, with the pole of a manually operable control switch 104 adapted to selectively connect the lead 98 with either a pattern mode switch terminal 106 or a random timing mode switch terminal 108. When in its pattern mode position, the switch 104 connects the base of the transistor 96 via lead 98, the pole and terminal 106 of switch 104 and a resistance 110 with the variable tap of a manually adjustable voltage dividing, pattern control potentiometer 112, the ends of which are connected between the positive power lead 16 and ground. When in its random timing mode position, the switch 104 connects the base of the transistor 96 via lead 98, the pole and terminal 108 of switch 104 and a lead 114 with the center tap of a voltage divider employing resistances 116 and 118 series connected between the feedback signal lead 86 and the negative power lead 18 (although it is noted that the desired signal to be derived from the tap of the voltage divider 116–118 should be of positive polarity, so that resistance 116 may be say, 38,000 ohms and resistance 118 typically 330,000 ohms).

Since the internal emitter to collector conductance of the transistor 96 is dependent upon and increases with with decreases in level of the positive potential applied to the base thereof, it will be apparent that the level of current flow constituting the significant output from the collector of transistor 96 to the sawtooth generator unit 21 via lead 80 will also depend upon and decrease with the level of the positive potential applied to the base of the transistor 96. Moreover, it may already be observed that, with pattern mode operation selected, the current flow level at output lead 80 will be essentially constant although subject to manually controlled change in response to adjustment of the pattern control potentiometer 112, while, with random timing mode operation selected, the current flow level at output lead 80 may be expected to be changing with time in accordance with the voltage waveform of the feedback signal on lead 86. The ultimate effects of both of such control modes will be further explained at a appropriate point hereinafter; however, it may be helpful to note even at this stage of the description that, since in the random mode the waveform of the feedback signal on lead 86 influences the level of the current output from the unit 19 while the latter in turn will influence the waveform of such feedback signal (as hereinafter described), what is believed to be a unique, and certainly a simple and most reliable, technique for producing a random type control signal has been achieved.

The current controlled, sawtooth reference generator unit 21 employs a uni-junction transistor 120 (which may be a type 2N4871) having one base resistance coupled to the positive power lead 16, is other base grounded and its emitter coupled with ground through a capacitance 122. The control current coming from the unit 19 via lead 80 is coupled to the emitter of the transistor 120, and thereby also to the ungrounded side of the capacitance 122. The transistor 120 operates as a relaxation oscillator in fashion generally similar to that already explained in connection with the transistor 26 of the unit 11 of FIG. 1, with one primary exception. In the unit 21, the output is derived from the emitter of the transistor 120 and the "top" of the capacitance 122 (rather than a base on the "opposite side" of the transistor as in the unit 11), so that the voltage waveform of the output to the lead 76 from the unit 21 is in the form of a continuing sawtooth voltage, first rising with characteristic slope during the portion of the oscillation cycle that the capacitance 122 is charging to the potential required for triggering relaxation, then sharply dropping to near zero durng the highly conductive condition of the transistor 120 as relaxation occurs, then promptly resuming the next sloped rise for producing the next "tooth" of the sawtooth waveform, as contrasted with the widely spaced, narrow spike-like pulses produced by the unit 11.

Since the rate at which the capacitance 122 will charge to a potential necessary for initiation of the relaxation phase of the oscillation cycle of the unit 21 is dependent upon the level of current flow output from the unit 19 through lead 80, it will be perceived that, during the pattern mode of operation, the frequency or repetition rate of the sawtooth wave output from the unit 21 will be adjustable by means of the pattern control potentiometer 112 of the unit 19 but will remain essentially constant for any particular manual setting of such control 112, while during the random timing mode of operation, the frequency or repetition rate of the sawtooth wave output from the unit 21 will change on a continuing basis in response to the effect upon the time required by the capacitance 122 to accumulate each "relaxation triggering" charge from a current output from the unit 19 that is changing in level on a continuing basis in accordance with the voltage waveform of the feedback signal on lead 86. A desirable range of variation for the frequency of the sawtooth output from the unit 21, either manually controlled in the pattern mode or dynamically produced in the random timing mode, is from about 1–100 cycles per second (which range may typically be provided with a capacitance 122 of about 2 microfarads in combination with the other components and potential levels suggested by the preferred embodiment).

The gate or sample and hold unit 23 employs a field effect switching transistor 124 (which may be of a type 2N4304), having its drain element coupled with the sawtooth voltage output from the unit 21 via leads 76 and 78, its gate element coupled with the tempo "clocking" pulse output from the multivibrator unit 15 via lead 66 and point 22, and its source element coupled both to one terminal of a capacitance 126 having its other terminal electrically grounded (which may be of about .01 microfarads) and to the output lead 82 for the unit 23. The diode 125 interposed in lead 66 merely prevents the voltage of the pulses applied to the gate element of the transistor 124 from ever exceeding the voltage of the sawtooth input to the drain element of such transistor 124, to assure proper operation of the latter in performing its gated switching function.

The functioning of the unit 23 can be easier understood when considered in conjunction with the follower unit 25, and particularly that isolating attribute of the latter by which it can "pass" to its own output lead 84 a voltage waveform output received from the unit 23 via lead 82 without affecting whatever state of charge potential exists on the capacitance 126.

The follower unit 25 employs another field effect transistor 128 (which may be a type 2N4304), having its gate element receiving the potential from the output of the unit 23 via lead 82, its drain element directly coupled with the positive power lead 16, and its source element coupled with the output lead 84 of the unit 25, as well as through an output load resistance 130 to ground. With its drain element being continuously coupled with the positive supply, the transistor 128 thus functions in the conventional manner of a follower in which the potential of the output on lead 84 from its source element "follows" the potential applied to its gate element via lead 82 from the sample and hold unit 23, and more specifically from the ungrounded "top" of the capacitance 126 thereof (but about 4 volts higher than the latter). The functional significance of the employment of the follower unit 25 in conjunction with the sample and hold unit 23 is that the high impedance characteristics at the input of the follower unit 25 permit production at its output lead 84 of an output voltage "following" the potential of the charge on the capacitance 126 without affecting or discharging the latter by loading.

With the foregoing in mind, the memory-like joint functioning of the sample and hold unit 23 and the follower unit 25 in response to gating "tempo" pulses from the multivibrator unit 15 and the sawtooth voltage output of the generator unit 21, will be more readily understandable. With either the pattern mode or the random timing mode of operation selected by the switch 104 of the unit 19, a sawtooth voltage of some (perhaps varying) frequency or repetition rate will be continuously fed to the drain element of the transistor 124 of the sample and hold unit 23 via lead 78. Between the occurrence of gating tempo pulses supplied via lead 66 from the multivibrator unit 15 to the gate element of the transistor 124 of the unit 23, the latter will remain cut-off, presenting a very high internal impedance to the flow of current between the drain and souce elements of the transistor 124. Thus, between gating pulses from the unit 15, the charge upon the capacitance 126 and the potential on its ungrounded top will remain constant in view of the "isolating" function of the follower unit 25. Moreover, between such gating pulses to the unit 23 via lead 66, the poential of the output voltage at lead 84 of the follower unit 25 will remain constant despite continuous changing of the potential level of the sawtooth voltage being fed to the drain element of the transistor 124 via lead 78. This is the hold or memory aspect of the functioning of the sample and hold unit 23. The sample phase of such functioning occurs during the application of each successive gating tempo pulse from the multivibrator unit 15 to the gate element of the transistor 124. During the duration of each such gating pulse (which, as above noted, may be about 50 microseconds), the transistor 124 is rendered highly conductive between its drain and source elements. Such "gating periods" of the transistor 124 are each of such short duration relative to the frequency or repetition rate of the sawtooth voltage input being applied to the drain element of the transistor 124, that each gating pulse "samples" the instantaneous potential of the input to the drain element along the time-varying slope of its sawtooth waveform and, via the then highly conductive internal drain-source path through the transistor 124, adjusts the charge upon the capacitance 126 upwardly or downwardly to the potential of the sampled portion of the sawtooth voltage on lead 78. Thus, the charge potential on the capacitance 126 is adjusted during each gating pulse to the sampled instantaneous potential of the sawtooth voltage input to the drain element of the transistor 124, and such charge potential is then maintained or held until the next adjustment thereof during a subsequent gating pulse. In general, this in turn results in the output at lead 84 of the follower unit 25 being a voltage waveform of stepped character, the potential level of which may typically change upwardly or downwardly with the occurrence of each gating pulse from the multivibrator unit 15.

Since the wave form of the voltage output from the follower unit 25 to the lead 84 not only controls the tempo of the tone sequences produced by the apparatus in accordance with the length or duration of the steps of such wave form, but also controls the frequency or pitch of such tones in manner related to the level or amplitude of such steps, it will be more meaningful to consider the effect of particular forms of stepped output wave at the lead 84 with respect to both tempo and pitch concurrently. As a basis for that consideration, it is first necessary to refer to the construction and general operation of the voltage controlled generator unit 27. In so doing, it will be observed that certain other components coupled with the output lead 84 from the follower unit 25 will be momentarily ignored with the understanding that they pertain to certain special effects that may be produced for modifying the tone sequence output of the apparatus, as later explained. For present purposes, however, it is sufficient to note that the voltage wave form output on the lead 84 is carried via resistance 92 and lead 90 to the tone generator unit 27 as the primary input to the latter.

The tone generator 27 employs a first transistor 132 (which may typically be a PNP type 2N5138) operating as a voltage controlled current source. The input from lead 90 is applied to the base of the transistor 132; the emitter of transistor 132 is connected through a coupling resistance 134 and a lead 136 with the positive supply lead 16; and the current output of the transistor 132 is derived from the collector element thereof and delivered to the output lead 138. A resistance 140 coupled between the input lead 90 and ground serves as an input resistance for the base element of the transistor 132. The effect of the potential level of the input voltage delivered to the base of the transistor 132 is inverted in the sense that, the more positive the level of the input voltage the lower will be the current output to the lead 138.

The unit 27 also includes a second transistor of the uni-junction type (typically a type 2N4871) operating as a relaxation oscillator. The current output lead 138 from the transistor 132 is coupled with the emitter of the transistor 142 and also via a lead 144 and one gang 146 of a pitch or frequency range selector switch also having a second gang 148. The gang 146 of such pitch range selector switch is adapted to couple the emitter of the transistor 142 with any chosen one of a plurality of capacitors 150, which it will be appreciated serves as the capacitance required at the input of the transistor 142 for it to operate as a relaxation oscillator. The other bank 148 of such pitch range selector switch concurrently operates in at least certain positions to couple an appropriate resistance 152 in parallel across the resistance 92 to provide an appropriate input impedance for the current source 32 dependent upon the capacitor 150 coupled with its output lead 138 as a functional part of the relaxation oscillator operation of the transistor 142. It will be noted that one base of the transistor 142 is grounded, while the other base thereof is coupled through a resistance 154 and the lead 136 with the positive supply lead 16. Thus in the preferred configuration of the unit 27, the output from the relaxation oscillator transistor 142 is also derived from its emitter element via output lead 94, from which it is carried to the portion of the apparatus shown in FIG. 3 via the connection point 8. As will be understood by those skilled in the art, the output of the unit 27 presented at the lead 94 is essentially a sawtooth type voltage wave, the repetition rate or frequency of which varies dependent upon the potential level of each step of the input to the unit 27 via the lead 90. It is the frequency of this sawtooth output at lead 94 which determines the pitch of tone being generated during each step of the input voltage applied to the unit 27 via the lead 90, with such pitch being adapted to change with each variation in step level of such input potential. Two relations applicable to this portion of the preferred embodiment of the apparatus should be noted. First, the greater the current output at the output lead 138 of the current source transistor 132, the higher will be the frequency of the sawtooth output to lead 94 from the relaxation oscillator transistor 142. Accordingly, and bearing in mind the mentioned inverted effect of the input to the unit 27, it will be understood that the frequency or pitch of the tone generated at the output lead 94 from the unit 27 rises as the potential level of the "stepped wave" output from the follower 25 at the lead 84 decreases, and vice versa.

The effect of the selection between pattern and random timing modes of operation and certain other controllable parameters, upon the character of the stepped voltage waveform output at the lead 84 upon the tempo and pitch characteristics of the tone output at the lead 94, may now be considered. The relevant manual controls having a primary influence upon one or more of the tempo, patterning or pitch of tone sequences are the basic tempo control potentiometer 46 and the feedback influence control potentiometer 54 of the voltage controlled, current source unit 13 (FIG. 1); the pattern vis-a-vis timing mode switch 104 of the voltage controlled, current generator unit 19 (FIG. 2); when the mode switch 104 is in the pattern mode, the pattern control potentiometer 112 of the current generator unit 19 (FIG. 2); and the range selection switch 146–148 (FIG. 2). The significant control signal affecting the tone sequence output at lead 94 is the stepped waveform, voltage output presented at the output lead 84 of the follower unit 25 (FIG. 2), which is not only delivered as the control input to the tone generator unit 27 via lead 90, but also is carried as a feedback control signal to the current source unit 13 (FIG. 1) via leads 86 and 60 on a continuous basis and to the current generator unit 19 (FIG. 2) via leads 86 and 88 for use when the mode switch 104 is in its random timing condition. It is a significant feature of the apparatus that the mentioned controls and parameters may be selectively adjusted to provide an almost infinite variety of tempo, patterning and pitch effects. Consideration of examples involving what might be regarded as "boundary" conditions of certain of the variable parameters should be sufficient for those skilled in the art to recognize the countless other variations of effect that are not only possible by combining different selections of control parameters, but most of which are also reliably reproducible due to the stability of the apparatus and assuming only that the manual controls are suitably calibrated and adjusted.

Consider first the nature of the voltage output waveform presented to the lead 84 from the follower unit 25 with the mode switch 104 of unit 19 in its pattern position and influence control 54 of unit 13 set to its minimum or no influence position. In this condition, the frequency or repetition rate of the teeth of the sawtooth voltage applied to the drain of the transistor 124 of the sample and hold unit 23 from the sawtooth generator unit 21 via lead 78 will be directly controlled and maintained solely by the setting of the pattern control potentiometer 112 of the unit 19; while the repetition rate of the gating pulses applied to the gate element of the transistor 124 of the unit 23 from the multivibrator unit 15 via lead 66 will be directly controlled and maintained solely by the setting of the basic tempo control potentiometer 46 of the unit 13. The potential to which the charge on the capacitor 126 of the sample and hold unit 23 is adjusted during the "sample period" of each gating pulse, and thereby the voltage of the output from the follower unit 25 to the lead 84, thus is dependent upon the potential level of the particular portion of the slope of a tooth of the sawtooth voltage from the unit 21 with which each gating pulse from the unit 15 coincides in time. Initially assume the least interesting case in which the potentiometers 112 and 46 are so adjusted that the repetition rates of the sawtooth voltage and the gating pulses are exactly the same; in such case, the successive gating pulses will each coincide in time with exactly the same portion of the slope of the corresponding sawtooth, with the result that the output to lead 84 from the follower unit 25 is a voltage of continuing constant level (which would produce at the output lead 94 from the tone generator unit 27 a sawtooth wave of constant frequency having as its audible equivalent one continuous tone of constant pitch dependent upon the pitch or "octaves" range selected by the switch 136–148 and the particular level of the sawtooth slope with which the gating pulses are "synchronized" at the same frequency). Assume next, however, that the potentiometers 112 and 46 are adjusted to make the repetition rate of the gating pulses slightly slower (or faster) than the repetition rate of the sawtooth voltage; in such case, the successive gating pulses will each coincide in time with a progressively higher (or lower) potential level portion of the slope of the corresponding sawtooth, with the result that the voltage output at lead 84 will step to a higher (or lower) level with the occurrence of each gating pulse over a relatively long series of tones, and the further result that the pitch of the tone output at lead 94 will gradually decrease (or increase) with each successive step of the output at lead 84 delineated from the preceding step at the time of occurrence of the corresponding gating pulse. After a sufficient period of time for the portion of the sawtooth wave with which successive gating pulses coincide to arrive at the top (or bottom) of a given tooth of the sawtooth wave, the next gating pulse will then coincide with a low (or high) portion of a following tooth of the sawtooth wave and the progression of lower and lower (or higher and higher) will then be repeated (but not necessarily at the same identical pitch levels as during the preceding series). As the differential between the repetition rates of the gating pulses and the sawtooth wave is increased by appropriate adjustment of the potentiometers 112 and 46, the differences in pitch between successive tones will change. and the number of tones in each series before the mentioned "recycling" of pitch level will also change. If a relationship is selected between the repetition rates of the gating pulses and the sawtooth wave that would define an arithmetically irrational ratio between such frequencies, then the pitch levels of tones in successive series thereof will differ, at least over some considerable period of time. On the other hand, if the repetition rates of the gating pulses and the sawtooth wave are so adjusted as to have the ratio of the gate pulse frequency to the sawtooth frequency equal to a ratio of two integers, then the pitches of the tones involved in each successive series thereof may be expected to repeat over relatively shorter periods of time. For example, with a ratio between the gate and sawtooth repetition rates of 4:3, repetition of pitch-size identical tone series of 4 tones each would be expected. In all of the cases thus far considered, it will be understood that the tempo of successive tones is established by the setting of the potentiometer 46 and that each step of the output at lead 84 and each tone signal produced at the output lead 94 will be of the same length and occur at a repetition rate established by the setting of the tempo potentiometer 46.

Consider secondly the effect of advancing the influence control potentiometer 54 in the previously described direction for permitting the feedback signal arriving at the unit 13 via lead 60 to have a substantial effect upon the current being delivered to the capacitance 32 of the relaxation oscillator clock unit 11. The mentioned feedback voltage delivered to the unit 13 is, of course, derived directly from the stepped output of the follower 25 via leads 84, 86 and 60. Thus, with each change in the level of the stepped output from the follower 25, a different level of feedback will be applied to the unit 13, which in turn will alter the amount of charging current delivered to the capacitance 32 of the unit 11, which finally alters the repetition rate of the gating pulses delivered from the multivibrator unit 15 to the sample and hold unit 23. As those skilled in the art will appreciate, this results in random, countless variations of change in the tempo pattern of the stepped output at the lead 84 of the follower unit 25, which will then recirculate via the feedback path to the unit 13 to provide complex and truly random tempo variations and effects in which successive tones generated by the apparatus may be of quite differing lengths. The setting of the basic tempo control potentiometer 46 always tends, however, to establish a basic tempo from which such random departures may occur, which tends to maintain the range of tempo variations within bounds that are interesting and pleasant from the melodic point of view. As will be apparent, the extent of such randomness in the tempo of the tone sequences being generated may be adjusted as desired with the influence control potentiometer 54. As will be apparent, since such randomness in the repetition rate of the gating pulses delivered to the sample and hold unit 23 will affect not only the tempo of the steps in the output at lead 84, but also the potential level of each such step by virtue of differing positions of the slope of the sawtooth input to the unit 23 with which the random gating pulses will coincide (even when the repetition rate of the sawtooth input remains constant as set by adjustment as set by the pattern control potentiometer 112), the pitch of the successive tones produced at the output lead 94 from the tone generator unit 27 will also vary in random fashion. Thus, each period of operation of the apparatus in the assume condition produces an interesting composition of successive tones of randomly varying tempo and pitch, the degree of randomness of which are basically controlled by the influence potentiometer 54. In such condition it may also be observed that a change in the repetition rate of the sawtooth input to the sample and hold unit 23 effected by readjustment of the pattern control 112 will provide still differing effects particularly with respect to variations in pitch.

As a third example, consider the effect of moving the mode switch 104 to its random position in which the frequency of the sawtooth input to the sample and hold unit 23 is effectively controlled by the nature of the stepped output at lead 84 itself, which is being delivered in feedback fashion to the unit 19 via leads 84, 86 and 88. In this condition, even with the influence control 54 set to a minimum or no influence position, the feedback of the step output at lead 84 to the unit 19 will result in a more or less continually changing repetition rate of the sawtooth input to the sample and hold unit 23 which, assuming tempo control entirely from the setting of the potentiometer 46, will result in sequences of tones of essentially uniform length or tempo but exhibiting essentially random characteristics with respect to pitch.

Fourthly, it should be apparent that with the mode switch 104 set to its random position and the influence potentiometer 54 adjusted to a high influence position, the tone sequence output at the lead 94 will exhibit what might well be deemed the ultimate of randomness in both its tempo and pitch characteristics.

FIG. 2 also illustrates the provisions made in the preferred embodiment for three types of special effects which may be selectively employed in conjunction with any of the selectable kinds of operation just previously noted. One of such effects involves the application of an alternating current modulating signal to the input to the stone generator unit 27, along with the other previously described signals applied thereto, to produce a wavering pitch or modulation effect in the tones being generated. This is implemented by a switchable circuit path from any suitable source of a, say 60 cycle, alternating current signal, represented by the terminal point 6, to the input lead 90 for the tone generator unit 27 via a lead 158, a modulation control switch 160, a lead 162 and a direct current isolating, coupling capacitance 164.

The second of such special effects involves the application of a sawtooth wave modulating signal to the input to the tone generator unit 27, along with the primary input thereto, to produce what is known as a glissandi effect in which the pitch of the tones being generated "glide" downwardly in frequency during each tooth of the sawtooth modulation wave. In the preferred embodiment, the sawtooth modulating wave is conveniently derived from the output lead 76 of the sawtooth reference generator unit 21, via a lead 166, a glissandi switch 168 and a coupling resistance 170 connected to the input lead 90 of the tone generator unit 27.

The third of such special effects involves the employment of selectable capacitances to ground from the input lead 90 of the oscillator unit 27 to produce a slurring or portamento effect in which the pitch transition from one note to the next is gradual or drifting in nature rather than instantaneous. Also selected resistances shunted to ground from the output lead 82 of the gate unit 23 will produce an upward glide after the initiation of each new pitch. These are implemented in the preferred embodiment by ganged switch poles 172 and 174 respectively coupled with leads 82 and 90 via leads 176 and 178 and a plurality of selectable contacts 180 and 182, to certain of which contacts 180 are connected one terminal of resistances 184 of differing respectively high values having their other terminal electrically grounded, and to certain of which contacts 182 are connected one terminal of capacitances 186 of differing values having their other terminal electrically grounded. In a first position of poles 172 and 174, the corresponding contacts 180 and 182 are floating, so that no slurring or portamento effect is invoked. In the next two illustrated positions, the lead 82 is shunted to ground through switch 172 and a selected resistance 184 to provide a selectable degree of drainage to ground for the charge otherwise held by the capacitor 126 of the gate or sample and hold unit 23, which results in an immediate slurring or rising characteristic in the pitch of each tone generated. In the remaining positions, the lead 90 is coupled to a grounded capacitance 186 of selected value, which produces a portamento or delayed drift in pitch effect through the integrating circuit action of the capacitance 186 in conjunction with the resistance 92. These special effects further increase the variety of the tonal sequences which may be generated by the apparatus.

Referring next to FIG. 3, the primary stages or modules illustrated are a buffer amplifier unit 29, a transient amplifier unit 31, a pair of alternately selectable frequency filtering units 33 and 37, and an output amplifier unit 35. Aside from the power and ground connections represented by the points 10″, 14″ and 12″, the significant inputs to the portion of the apparatus shown in FIG. 3 are the sawtooth wave, tone signals derived as the output of the tone generator unit 27 of FIG. 2 and delivered to the point 8 of FIG. 3 via lead 94, and the pulse train derived as the output of the multivibrator unit 17 of FIG. 1 and delivered to the point 24′ of FIG. 3 via lead 68. The significant output from the portion of the apparatus shown in FIG. 3 is the audio frequency tone sequence or pattern output presented at terminals 200 and 202, which are adapted for coupling with any suitable sound transducer such as a loudspeaker (not shown). In FIG. 3, the flow of significant signals includes the path of the output from the tone generator unit of FIG. 2 via the point 8 through the buffer amplifier unit 29, then the transient amplifier unit 31, then the selected one of the frequency filtering units 33 or 37, then the output amplifier unit 35, to the output terminals 200 and 202 and the sound transducer or other utilization device coupled with and implied by the latter.

The buffer amplifier unit 29 employs a field effect transistor 204 (which may be, for instance, of type 2N4304) having its gate element coupled via a lead 206 with the point 8 to receive from the latter, as the input to the unit 29, the sawtooth waveform, tone signals delivered as the output from the tone generator unit 27 shown in FIG. 2. The drain element of the transistor 204 is coupled with the positive supply line 16 via a lead 208; and the source element of the transistor 204, which serves as its output element, is coupled via a lead 210 to the transient amplifier unit 31 to provide the main signal input for the latter. As those skilled in the art will appreciate, the transistor 204 of the unit 29 acts in essentially the manner of a voltage controlled resistor with increased voltage at the gate element resulting in a decreased resistance between the drain and source elements, but with the amplification action characteristic of the FET also occurring, to provide buffered amplification of the tone signals from the generator unit 27 before they are fed to the transient amplifier unit 31.

The transient amplifier unit 31 employs a transistor 212 (which may be, for instance, of type 2N5133), a collector input resistance 214, a base input resistance 216, a capacitor 218, a rheostat 220, a pair of preferably silicon diodes 222 and 224, a pair of ganged manual selector switches 226 and 228, and a number of filter capacitances 230. The transistor 212 functions as a gate or electronic switch, such that when a positive control input is applied to its base element through resistance 216, the internal resistance between the collector and emitter elements is reduced to a negligible quantity to act as a closed switch, while, in the absence of such a positive input to the base element, the internal collector-to-emitter path has such a high impedance as to prevent essentially an open circuit therebetween. Since utilization of the function of the unit 31 (to modify the tone signals with a decaying volume or percussion effect) is preferably to be made available on a selective basis, it will be noted that the leftmost position of the switches 226 and 228 illustrated in FIG. 3 constitutes a means of selectively rendering the unit 31 essentially inactive. In such condition, a positive control voltage is derived from the positive supply line 10 via leads 20 and 232 and continuously applied through the switch 226 and the input resistance 216 to the base element of the transistor 212, which renders the internal collector-to-emitter path of the latter of such low impedance as to present essentially a short circuit or closed switch for passing the tone signal input received at the collector of the transistor 212 from the buffer amplifier unit 29 via lead 210 and input resistance 214 to the emitter of the transistor 212, and thence through the emitter lead 234 and the diode 224 to the output lead 236 of the unit 31 without substantial modification of the signals involved. In this condition of deactivation of the primary tone modifying function of the unit 31, it will be noted that the low impedance path through the internal collector-to-emitter structure of the transistor 212 and the emitter resistance 214 is shunted across the capacitance 218 and serves to prevent any substantial charge from developing on the latter. The more active condition of the unit 31, however, is with any of the other positions of the switches 226 and 228 selected, in which instances it will be noted that the relatively slow (as compared with the frequencies of the sawtooth tone input signals) gating pulses delivered to the point 24' of FIG. 3 from the multivibrator 17 of FIG. 1 are applied at the intervals determined by their repetition rate to the base of the transistor 212 via lead 238, the switch 26 in one of its rightward positions, and the input resistance 216. During each pulse from the multivibrator unit 17, the transistor 212 presents a very low impedance or essentially short-circuit path internally thereof between its emitter and collector, which provides a discharging path for the capacitance 218 traceable in shunt with the latter through lead 240, resistance 214, the transistor 212 and lead 234. During the intervals between such pulses, however, the internal path between the emitter and collector of the transistor 212 presents a very high impedance permitting the capacitance 218 to charge in response to the sawtooth waveform, tone input signals received from the buffer amplifier unit 29 via leads 210 and 240, the remainder of the charging circuit for the capacitance 218 being to ground through the rheostat 220. Thus, between pulses from the multivibrator unit 17, the capacitance 218 charges in response to the flow of a current through it and the rheostat 220 derived from the tone input signal. The rheostat 220 serves as an adjustable decay or sweep time control, which, by virtue of its effect upon the R-C time constant for the charging circuit for the capacitance 218, permits controlling the general rate at which the capacitance 218 will charge in response to given tone input signals. During such charging of the capacitance 218, the potential presented at the top of the capacitor connected with lead 240 progressively and exponentially rises toward the positive supply voltage, as a fully charged condition of the capacitance 218 is approached. The ungrounded end of rheostat 220 remains at near DC ground, but across it lies the AC signal, an exponentially decreasing (in amplitude) sawtooth wave. Upon the next pulse from the multivibrator unit 17, the capacitance 218 is discharged through the mentioned path through the transistor 212, so that the charging cycle can be repeated during the next interval between such pulses. The resulting waveform applied to lead 234, and thence to the cathode of an output diode 224 and the output lead 236 of the unit 31, is a series of decreasing amplitude sawtooths in which, however, the pitch and other characteristics of the higher frequency tone signal input is otherwise preserved. The musical effect produced is that of a series of sharply attacked notes whose amplitudes diminish rapidly after initiation to provide a percussion-like impression on the listener. The anode of an oppositely grounded clamping diode 222 is coupled to the lead 234 to eliminate any negative components from the output waveform. It will be noted that, with the switch 228 in certain rightward positions thereof, a selected one of any desired number of oppositely grounded capacitances 230 will be coupled with the anode or output side of the output diode 224. Such selectable capacitances 230 provide, in combination with the effective resistance of the diode 224, an adjustable low pass filter, it being noted that the switch 228 also preferably includes one position (illustrated as second from leftmost) in which such low pass filter is deactivated.

The frequency filtering unit 33, which is one of two (33 and 37) illustrated in the preferred embodiment as being selectively available (but either of which might be chosen for incorporation in a particular commercial embodiment), will be described first. The unit 33 has an input lead 240 adapted for coupling with the output lead 236 of the unit 31, as via a filter unit selecting switch 242. The input lead 240 is coupled through a resistance 244 with an output lead 246 for the unit 33, and the output lead 246 may be selectively coupled with any of an appropriate selection of oppositely grounded, filtering components or combinations thereof through a selector switch having a pair of ganged poles 248 and 250. In the preferred embodiment shown for illustrative purposes, with the poles 248 and 250 in their leftmost positions, the filtering components of the unit 33 are disconnected from the output lead 246 and inactive; with the poles 248 and 250 in their next two rightward positions, selectable bandpass filters are provided by parallel connection of the output lead 246 with an oppositely grounded inductance 252 and with a selected capacitance 254; with the poles 248 and 250 in their next rightward position, a band reject filter is provided by connection of the lead 246 to ground through a capacitance 256 connected in series with the inductance 252 by a lead 258; and with the poles 248 and 250 in their rightmost positions, a high pass filter is provided by connection of the lead 246 to the oppositely grounded inductance 252 only. Additional switch positions and filtering components may be provided as desired.

The output amplifier unit 35 will next be described and the alternate filtering unit 37 then considered. An input lead 260 for the output amplifier unit 35 is arranged for coupling with the output lead 246 of the filtering unit 33, as through a second filtering unit selector switch 262 preferably ganged for convenience with the switch 242. The input lead 260 is coupled with an oppositely grounded, volume control potentiometer 264 having a tap 266 (which, if only earphones not requiring further signal amplification are to be used for listening to the output of the apparatus, can be directly coupled to such oppositely grounded earphones). Where further signal amplification is needed to drive a loudspeaker or the like, however, the tap 266 may be conventionally coupled through a capacitance 268 to the base of an audio amplifier transistor 270. In the illustrated unit 35, the base of the transistor is also tapped between resistances 272 and 274, which are respectively oppositely coupled with the positive and negative power leads 16 and 18 and form a voltage divider establishing a reference potential for the base; the emitter is coupled with the negative power lead 18 through a paralleled resistance 276 and capacitance 278; and the collector of the transistor 270, which serves as its output terminal, is coupled with the positive power lead 16 through the primary winding of an audio output transformer 280 whose secondary winding provides the output terminals 200 and 202 for the apparatus to which a loudspeaker (or other suitable audio signal utilization device) will normally be connected.

The alternate filtering unit 37 provides for selection of a different class of controlled frequency filtering than the basic R-C-L filtering unit 33, which must be achieved through the employment of more sophisticated means. Whereas the unit 33 utilizes switchable combinations of reactive impedance components to provide a reasonable number of selectable types high pass, band pass or rejection filtering sufficient for many applications, the availability of the alternate unit 37 provides a much greater degree of control and additional filtering effects with respect to low pass filtering with a voltage controlled, adjustable cutt-off frequency and a controlled, variable response, resonance characteristic adjacent the cut-off frequency.

It is noted that voltage controlled, low pass filtering circuits, in general, have been previously known; see, for example, U.S. Pat. No. 3,475,623, issued to Robert A. Moog on Oct. 28, 1969. Such circuits have, however, normally required either electronically variable capacitors or transistors in sufficient number to provide the plurality of capacitative or resistance components employed in the R-C ladders of such filters, with the attendant effects upon manufacturing costs and operational factors that would be expected. The unit 37, however, improves upon such prior filters of the same general class, both by taking advantage of the discovery that, with appropriate design of the remainder of the circuit, ordinary diodes (which can be obtained with suitably matched characteristics at relatively low cost) can be employed for the resistance components of voltage controlled ladder R-C type filters of high reliability and precision, and by providing operational features particularly desirable in a filter to be employed in the application with which the apparatus of this invention is concerned.

The filtering unit 37 has an input lead 300 and an output lead 302, which are respectively selectively coupled with the output lead 236 from the transient amplifier unit 31 and the input lead 260 of the output amplifier unit 35 when the preferably ganged, filtering unit selection switches 242, 262 are appropriately positioned. The tone signals received from the unit 31 are fed through a coupling capacitor 304 to the base of the first of a pair of transistors 306 and 308 having their emitters coupled together by a lead 310, it being observed in passing that the base of the second transistor 308 is to receive a feedback signal produced in manner later described via a coupling capacitor 312. The bases of the transistors 306 and 308 are also respectively coupled through biasing resistances 314 and 316 and a common lead 315 with the tap point between the resistances 318 and 320 presenting a voltage divider oppositely coupled with the positive power lead 16 via leads 322 and 208 and with ground. An AC blocking capacitance 319 is shunted across the resistance 320 to ground. The collectors of the transistors 306 and 308, which are their output electrodes in the circuit configuration employed, are respectively coupled with the opposite sides of the bottom of a filter ladder 350 presented by, on the left and from bottom to top, the series connected diodes 324, 326, 328, 330 and 332; on the right and from bottom to top, the series connected diodes 325, 327, 329, 331 and 333; and, cross-connected between corresponding left and right pairs of adjacent interconnected diodes, the capacitances 334, 336, 338 and 340. At the top of the ladder 350, the diodes 332 and 333 are coupled with the positive power lead 16 via a lead 342.

The ability of the ladder 350 to provide effective and controllable filtering of the type normally expected only from more complex configurations of more expensive components, and specifically its ability to do so while using ordinary diodes in the sides of the ladder (rather than transistors requiring additional circuitry for the third element thereof employed for control) and while using ordinary fixed capacitances in the crossbars of the ladder (rather than electronically controlled variable capacitances also requiring additional circuitry for control), is attributable to recognition of the applicability and utilization of the property of diodes by which the series resistance of a diode to alternating current signals decreases as a series direct current also flowing therethrough increases. Thus, in the ladder 350, the diodes 324-333 are employed as electronically variable resistances (as to alternating current signals), the effective alternating current resistances of which are controlled by a direct current control current passed therethrough and of level controlled in manner hereinafter described. Before considering the details of how the ladder 350 is controlled to respond to and filter the tone input signals applied to the base of the transistor 306 in the desired fashion, however, it is appropriate to next turn attention to the output and feedback paths associated with the ladder 350.

A first intermediate output signal is derived from the lead 342 interconnecting the diodes 330 and 332 on the left side (which may be called the tone signal input side) of the ladder 350, the is fed via a coupling capacitance 344 and an input resistance 346 to the inverting input terminal of an operational amplifier 348 being employed as an A.C.-coupled differential amplifier. A second intermediate output signal is derived from the lead 352 interconnecting the diodes 331 and 333 on the right side (which may be called the feedback signal side) of the ladder 350, and is fed via a coupling capacitance 354 and an input resistance 356 to the non-inverting input terminal of the differential amplifier 348. A resistance 358 is bridged from the inverting input terminal to the output terminal of the differential amplifier 348, and the non-inverting input terminal of the amplifier 348 is coupled with an oppositely grounded resistance 360. The differential amplifier 348, which is isolated from direct current voltages in the ladder 350 by the coupling capacitors 344 and 354, responds only to the alternating current components of the mentioned intermediate output signals and, further, responds only to changes in such signals that alter the relative difference between their respective A.C. levels, any concurrent changes of the same polarity and magnitude in such signals being ignored in the differential output produced by the amplifier 348 at its output terminal. Since the first or tone signal intermediate output from the left side of the ladder 350 is inverted by the amplifier 348, while the second or feedback signal intermediate output from the right side of the ladder 350 is not inverted by the amplifier 348, the output presented at the output terminal of the amplifier 348 is a signal representing the magnitude of the voltage differential between the inverted tone signal output and the non-inverted feedback signal output from the ladder 350. It is, of course, such differential output from the amplifier 348 that provides the filtered final output signal from the unit 37 to its output lead 302 through a coupling capacitance 362, to whose output side is connected an oppositely grounded discharge resistance 363.

Internally of the unit 37, however, the output terminal of the differential amplifier 348 is also significantly coupled with one end of a potentiometer 366, whose opposite end is attached to ground through a resistor 364, the potentiometer 366 having its adjustable tap coupled with the base of the transistor 308 through the capacitance 312. The potentiometer 366 serves as a feedback or regeneration control permitting adjustment of the level of the feedback applied to the base of the transistor 308 through a range extending from levels high enough to produce actual oscillations just below the cut-off frequency, through a level just below that required to sustain oscillations and at which the unit 37 manifests a resonance response effect just below the cut-off frequency, to lower levels at which the unit 37 operates as a low pass filter without such resonance effect.

The manner in which the thus far described portions of the filtering unit 37 operate should next be clarified from a consideration of the relationships of the various signals being concurrently applied to the ladder 350 from the transistors 306 and 308. First, transistor 370, being a current source or generator, controls the flow of direct current through transistors 306 and 308 and therefore the left and right sides of the ladder 350, in response to a control voltage fed to the emitter of transistor 370, its base being grounded through resistor 372 to prevent overload currents. And, for the moment, it need only be observed that the level of direct current made available at the collector of the transistor 370 is controlled by a voltage applied to its emitter and produced in a controlled manner later to be described. Secondly, it should be understood that the alternating current feedback signal applied to the right side of the ladder 350 from the collector of the transistor 308 is inverted from the alternating current tone signal applied to the left side of the ladder 350 from the collector of the transistor 306 (by virtue of the inverting action of the transistor 308 and the manner in which the input for the inverting input terminal of the differential amplifier 348 is derived from the left or tone signal side of the ladder 350) so that such alternating current signals respectively applied to the left and right sides of the ladder 350 are essentially 180° out-of-phase with each other. Thirdly, by virtue of the previously noted effect by which the resistance of the diodes 326–333 to alternating current signals is reduced as the level of a concurrent flow of a direct current control signal therethrough is increased, when the direct current control signal to both sides of the ladder 350 is raised to a relatively high level, the mentioned alternating current signals also passing up the respective sides of the ladder 350 will encounter little resistance from the diodes 326–333 and will exert little or no cancelling effect on each other despite their directly out-of-phase relationship. However, if the direct current control signal applied to the sides of the ladder 350 is lowered so that the effective resistances of the diodes 326–333 to alternating current signals becomes more substantial, the out-of-phase tone and feedback signals will increasingly tend to cancel each other through the cross-bar capacitances 334, 336, 338 and 340. With any given level of direct current control signal, the higher frequencies of the alternating current tone and feedback signals will shunt across the cross-bar capacitors 334, 336, 338 and 340 to a much greater extent that the lower frequency components of such signals, so that the latter are left to pass on up the ladder 350 to the output of the latter, thereby effecting the desired type of low pass filtering. Moreover, since the effective resistance of the diodes 326-333, and therefore the susceptibility of the higher frequencies to cancel each other between the sides of the ladder 350, are dependent upon the level of the direct current control signal concurrently flowing through the ladder 350, it will be apparent that the high frequency cut-off of the filter may be controlled or adjusted through control or adjustment of the level of such direct current control signal. Fourthly, besides the noted important function of the inverted feedback signal to the right side of the ladder 350 in permitting the latter to function as a low pass filter of variable resonance, the regeneration control potentiometer 366 permits achieving a special added effect, when desired. When the potentiometer 366 is adjusted to provide a level of feedback signal just below that at which oscillation through the transistor 308, the right side of the ladder 350, the differential amplifier 348 and the remainder of the feedback loop would occur, the ladder 350 exhibits a behavior akin to resonance for frequencies at or just below the cut-off frequency at which the filter is being operated, with the result that any components of the tone signal within such relatively narrow range of "resonance" frequencies will be emphasized and accentuated in the filtered output from the unit 37.

It remains to consider the manner in which the transistor current generator 370 is controlled or influenced to provide the variable level of direct current control signal which determines the cut-off frequency of the low pass filtering action of the ladder 350. The level of current output from the collector of the transistor 370 increases logarithmically in proportion to the voltage applied to the emitter of the transistor 370 via a lead 374 from the output terminal of an operational amplifier 376 functioning as a voltage adder. When an operational amplifier is employed for such purpose, as with the amplifier 376 of the filtering unit 37, the voltage at the output terminal thereof will attempt to maintain itself at whatever level might be required, in view of the presence of a resistance 378 coupling such output terminal with the negative input terminal of the amplifier, which is at the very same voltage level that exists at the positive input terminal to such amplifier. Since the positive input terminal of the amplifier 376 is grounded, the voltage presented at the output of the amplifier 376 will continually seek a level tending insofar as possible to bring the voltage at the negative input terminal of the amplifier 376 towards zero or ground level. Three input resistances 380, 382 and 384 are coupled with the negative terminal of the amplifier 376 to couple currents to the latter derived from various voltage sources; the resistance 380 receives its potential from the tap of a potentiometer 386 which is grounded at one end and coupled at its other end with the positive voltage supply lead 16 via leads 388 and 208; the resistance 382 is coupled directly with the positive supply lead 10 via leads 390 and 342; and the resistance 384 is coupled with a terminal 392 to which any suitable external voltage source may be connected. The current flowing through each of the resistances 380, 382 and 384 is determined by the voltage applied to such resistance divided by its resistance value. By virtue of the noted manner of functioning of the amplifier 376 when employed in an adder configuration, however, and since the positive input terminal of the amplifier 376 is grounded, it will be understood that the output from the amplifier 376 will tend to adjust itself to a level such that no voltage difference will exist between the positive and negative inputs of the amplifier 376. As will be apparent this must be and is accomplished by the amplifier 376 providing an output such that the direction and level of current flow through the resistance 378 will exactly balance the sum of the currents flowing through the input resistances 380, 382 and 384. Thus, the voltage output to the lead 374 and the emitter element of the voltage controlled current generator 370 is of the potential level produced by the summing current flowing through the resistance 378 to maintain the amplifier 376 in the previously mentioned condition of equilibrium.

A further refinement of the adder amplifier configuration employed in the unit 37 arises from appropriate selection of the relationship between the value of the resistance 378 and the values of the resistances 380 and 384. Thus, if the values of the resistances 380 and 384 are made equal to each other and the value of the resistance 378 is then chosen to provide a preselected change in the potential delivered to the emitter of the transistor 370 for a given unit type change in the level of the potentials supplied to any of the adder control input resistances 380 and 384, a convenient predetermined relationship may be established between a unit change of the potential applied to any of the adder control resistances 380 and 384 and the resulting effect thereof upon the cut-off frequency of the ladder filter 350. For example, in the preferred embodiment, the value for the resistance 380 was selected as equal to 0.0185 of the value of each of the adder input resistances 380, 382 and 384. With such component value selection, the voltage output to the emitter of the transistor 370 will be equal to .0185 of the sum of the voltages applied to the adder input resistances 380, 382 and 384. The transistor 370 is of characteristics such that an increase of 18.5 millivolts in the control voltage applied to its emitter will result in doubling the current output from its collector element. Since the cut-off frequency of the ladder filter 350 also varies substantially linearly with the level of the direct current control signal applied thereto, it is apparent that an increase of 18.5 millivolts in the level of the control signal applied to the emitter of the transistor 370 will result in a 2:1 or one octave (in the musical sense) change in the effective cut-off frequency of the ladder filter 350. In order to achieve such one octave variation in the cut-off frequency of the ladder filter 350 for each one volt of change in the potential applied to either of the adder control input resistances 380 and 384, therefore, such adder control input resistances 380 and 384 were selected to be of 100,000 ohms each, while the value for the resistance 378 was selected at 1,850 ohms. Resistor 382 was chosen to be a value which, when as shown is connected to the positive lead 16 of the power supply, would cause the output voltage of the amplifier 376, and therefore the emitter-base voltage of the transistor 370, to go to a value which would cause current to flow in the transistor 370, were no voltage inputs present at resistors 380 or 384. Without resistor 382, no current would ever flow. So then, resistor 382 provides a quiescent reference current which is chosen to be a size which causes the cutoff frequency to go to its lowest usable value when no voltage inputs appear at resistors 380 or 384. Those skilled in the art will understand that different specific values could be selected or would be appropriate depending upon extraneous factors such as the particular transistor component 370 to be used. With appropriate values selected as noted, however, it will be clear that adjustment of the tap of the potentiometer 386 so as to produce some preselected unit change in the potential applied to the resistance 380 will directly correlate with effecting a resulting change of one octave in the cut-off frequency of the ladder filter 350, it being noted that such feature of the unit 37 may be even more significant when the cut-off frequency of the filter 350 is to respond to an external voltage applied to the terminal 392 provided for that purpose.

It is believed that those skilled in the art will appreciate from the foregoing description of the preferred embodiment of the invention that it is well adapted to achieve all of the objectives of the invention in versatile, reliable and economic fashion. It will be further apparent, however, that various minor changes as to various details of the preferred form of apparatus disclosed for illustrative purposes could be made without departing from the real spirit and essence of the invention. Accordingly, it should be understood that it is intended for the invention to be limited only by the fair scope of the claims that follow and mechanical equivalents thereof.

I claim:

1. In apparatus for generating an audio frequency electrical signal adapted for transduction to produce a series of audible tones providing a musical effect:

time reference means having an output terminal, for generating and presenting at said output terminal thereof a first electrical signal having the character of a series of pulses occurring at a first repetition rate, said time reference means including current controlled, clock oscillator means having a control input terminal and configured to oscillate at a frequency determined as a function of the level of an electrical control current applied to said control input terminal thereof, said time reference means further including current source means having an output terminal electrically coupled with said control input terminal of said clock oscillator means for delivering an electrical control current to the latter;

gating means having a switchable electrical path therethrough and a control input terminal electrically coupled with said output terminal of said time reference means, for rendering said switchable path electrically conductive in response to said first electrical signal at intervals corresponding in predetermined manner with said first repetition rate;

variable electrical level reference means having an output terminal, for generating and presenting at said output terminal thereof a second electrical signal having the character of a series of sawtooth waves occurring at a second repetition rate and each having an instantaneous level varying as a function of time;

memory means having an output terminal and an input terminal electrically coupled with said output terminal of said level reference means through said switchable path of said gating means, for storing the instantaneous level of said second electrical signal whenever said switchable path is electrically conductive and for presenting at said output terminal thereof a third electrical signal having the character of a stepped-level wave in which the successive steps are initiated at intervals corresponding in predetermined manner with said first repetition rate and are of levels corresponding in predetermined manner with the instantaneous level of said second electrical signal that was last previously stored by said memory means; and tone signal producing means having an output terminal and an input terminal electrically coupled with said output terminal of said memory means, for generating and presenting of said output terminal thereof a fourth electrical signal having the character of a series of tone-representing, audio frequency waveforms occurring in time concurrence with the steps of said third electrical signal and of frequency corresponding in predetermined manner with the concurrent level of said third electrical signal.

2. The invention of claim 1, wherein said current source means includes:

tempo control means for varying said first repetition rate of said first electrical signal, including current level control means for varying the level of said control current delivered by said current source means to said control input terminal of said clock oscillator means.

3. The invention of claim 2, wherein said current level control means includes:

voltage controlled means having at least one control input terminal and configured for varying the level of said control current delivered by said current source means to said control input terminal of said clock oscillator means in response to variation of the potential level of an electrical control signal applied to said one control input terminal of said voltage controlled means; and means for applying a first electrical tempo control signal of varying potential level of said one control input terminal of said voltage controlled means.

4. The invention of claim 3, wherein said first tempo control signal applying means includes:

electrical circuit means for coupling said output terminal of said memory means withe said one control input terminal of said voltage controlled means to provide a feedback path for said third electrical signal from said memory means to said voltage controlled means, whereby said third electrical signal may serve as said first tempo control signal.

5. The invention of claim 4, wherein said voltage controlled means has a second control input terminal and is configured for also varying the level of said control current delivered by said current source means to said control input terminal of said clock oscillator means in response to variation of the potential level of an electrical control signal applied to said second control input terminal of said voltage controlled means, and said current level control means includes:

means for applying a second electrical tempo control signal of selectably variable voltage level to said second control input terminal of said voltage controlled means; and impedance means electrically coupled with said one control input terminal and said second control input terminal of said voltage controlled means and adjustable for selectively varying the relative influence of said first and second tempo control signals upon the level of said control current delivered by said current source means to said input terminal of said clock oscillator means.

6. The invention of claim 1, wherein said level reference means includes:

current controlled, sawtooth oscillator means having a control input terminal and configured to oscillate at a frequency determined as a function of the level of an electrical control current applied to said control input terminal thereof; and current generator means having an output terminal electrically coupled with said control input terminal of said sawtooth oscillator means for delivering an electrical control current to the latter.

7. In apparatus for generating an audio frequency electrical signal adapted for transduction to produce a series of audible tones providing a musical effect:

time reference means having an output terminal, for generating and presenting at said output terminal thereof a first electrical signal having the character of a series of pulses occurring at a first repetition rate;

gating means having a switchable electrical path therethrough and a control input terminal electrically coupled with said output terminal of said time reference means, for rendering said switchable path electrically conductive in response to said first electrical signal at intervals corresponding in predetermined manner with said first repetition rate;

variable electrical level reference means having an output terminal, for generating and presenting at said output terminal thereof a second electrical signal having the character of a series of sawtooth waves occurring at a second repetition rate and each having an instantaneous level varying as a function of time, said level reference means including current controlled, sawtooth oscillator means having a control input terminal and configured to oscillate at a frequency determined as a function to the level of an electrical control current applied to said control input terminal thereof, said level reference means further including current generator means having an output terminal electrically coupled with said control input terminal of said sawtooth oscillator means for delivering an electrical control current to the latter, said current generating means including pattern control means for varying said second repetition rate of said second electrical signal, including current level control structure for varying the level of said control delivered by said current generator means to said control input terminal of said sawtooth oscillator means;

memory means having an output terminal and an input terminal electrically coupled with said output terminal of said level reference means through said switchable path of said gating means, for storing the instantaneous level of said second electriccal siignal whenever said switchable path is electrically conductive and for presenting at said output terminal thereof a third electrical signal having the character of a stepped-level wave in which the successive steps are initiated at intervals corresponding in predetermined manner with said first repetition rate and are of levels corresponding in predetermined manner with the instantaneous level of said second electrical signal that was last previously stored by said memory means; and tone signal producing means having an output terminal and an input terminal electrically coupled with said output terminal of said memory means, for generating and presenting at said output terminal thereof a fourth electrical signal having the character of a series of tone-representing, audio frequency waveforms occurring in time concurrence with the steps of said third electrical signal and of frequency corresponding in predetermined manner with the concurrent level of said third electrical signal.

8. The invention of claim 7, wherein said current level control structure includes:

voltage controlled structure having at least one selectable control input terminal and configured, when said one control input terminal is selected, for varying the level of said control current delivered by said current generator means to said control input terminal of said sawtooth oscillator means in response to variation of the potential level of an electrical control signal applied to said one control input terminal of said voltage controlled structure; and means for applying a first electrical pattern control signal of selectably variable voltage level to said one control input terminal of said voltage controlled structure, whereby said second repetition rate of said second electrical signal may be adjusted relative to said first repetition rate of said first electrical signal into various particular relationship therebetween for selectively producing various types of regularly repeating, cyclic patterns in the characteristics of said third electrical signal and, thereby, of said fourth electrical signal.

9. The invention of claim 8, wherein said voltage controlled structure has a second selectable control input terminal and is configured, when said second control input terminal is selected, for varying the level of said control current delivered by said current generator means to said control input terminal of said sawtooth oscillator means to response to variation of the potential level of an electrical control signal applied to said second control input terminal of said voltage controlled structure, and said current level control structure includes:

electrical circuit means for coupling said output terminal of said memory means with said second control input terminal of said voltage controlled structure to provide a feedback path for said third electrical signal from said memory means to said voltage controlled structure, whereby said second repetition rate of said second electrical signal and, thereby, the characteristics of said third electrical signal and of said fourth electrical signal are caused to vary in complex, substantially random manner.

10. In apparatus for generating an audio frequency electrical signal adapted for transduction to produce a series of audible tones providing a musical effect:

time reference means having an output terminal, for generating and presenting at said output terminal thereof a first electrical signal having the character of a series of pulses occurring at a first repetition rate;

gating means having a switchable electrical path therethrough and a control input terminal electrically coupled with said output terminal of said time reference means, for rendering said switchable path electrically conductive in response to said first electrical signal at intervals corresponding in predetermined manner with said first repetition rate;

variable electrical level reference means having an output terminal, for generating and presenting at said output terminal thereof a second electrical signal having the character of a series of sawtooth waves occurring at a second repetition rate and each having an instantaneous level varying as a function of time;

memory means having an output terminal and an input terminal electrically coupled with said output terminal of said level reference means through said switchable path of said gating means, for storing the instantaneous level of said second electrical signal whenever said switchable path is electrically conductive and for presenting at said output terminal thereof a third electrical signal having the character of a stepped-level wave in which the successive steps are initiated at intervals corresponding in predetermined manner with said first repetition rate and are of levels corresponding in predetermined manner with the instantaneous level of said second electrical signal that was last previously stored by said memory means;

tone signal producing means having an output terminal and an input terminal electrically coupled with said output terminal of said memory means, for generating and presenting at said output terminal thereof a fourth electrical signal having the character of a series of tone-representing, audio frequency waveforms occurring in time concurrence with the steps of said third electrical signal and of frequency corresponding in predetermined manner with the concurrent level of said third electrical signal; and means for providing and applying a modulation signal to said input terminal of said tone signal producing means, whereby said third electrical signal is mixed with and modified by said modulation signal to thereby alter the characteristics of said fourth electrical signal.

11. The invention of claim 10, wherein said means for providing and applying a modulation signal includes:

electrical circuit means for coupling said output terminal of said time reference means with said input of said tone signal producing means.

12. In apparatus for generating an audio frequency electrical signal adapted for transduction to produce a series of audible tones providing a musical effect:

time reference means having an output terminal, for generating and presenting at said output terminal thereof a first electrical signal having the character of a series of pulses occurring at a first repetition rate;

gating means having a switchable electrical path therethrough and a control input terminal electrically coupled with said output terminal of said time reference means, for rendering said switchable path electrically conductive in response to said first electrical signal at intervals corresponding in predetermined manner with said first repetition rate;

variable electrical level reference means having an output terminal, for generating and presenting at said output terminal thereof a second electrical signal having the character of a series of sawtooth waves occurring at a second repetition rate and each having an instantaneous level varying as a function of time;

memory means having an output terminal and an input terminal electrically coupled with said output terminal of said level reference means through said switchable path of said gating means, for storing the instantaneous level of said second electrical signal whenever said switchable path is electrically conductive and for presenting at said output terminal thereof a third electrical signal having the character of a stepped-level wave in which the successive steps are initiated at intervals corresponding in predetermined manner with said first repetition rate and are of levels corresponding in predetermined manner with the instantaneous level of said second electrical signal that was last previously stored by said memory means;

tone signal producing means having an output terminal and an input terminal electrically coupled with said output terminal of said memory means, for generating and presenting at said output terminal thereof a fourth electrical signal having the character of a series of tone-representing, audio frequency waveforms occurring in time concurrence with the steps of said third electrical signal and of frequency corresponding in predetermined manner with the concurrent level of said third electrical signal;

a resistance electrically coupled in series between said output terminal of said memory means and said input terminal of said tone signal producing means;

capacitance means having a pair of terminals of which one is electrically grounded; and means for selectively electrically coupling the other terminal of said capacitance means with said input terminal of said tone signal producing means, whereby to provide a portamento effect in the characteristics of said waveforms of said fourth electrical signal.

13. The invention of claim 1, wherein said memory means includes:

a capacitance having a pair of terminals of which one is electrically coupled with said input terminal of said memory means and the other is electrically grounded; and a signal follower unit electrically coupled in series between said input terminal and said output terminal of said memory means.

14. In apparatus for generating an audio frequency electrical signal adapted for transduction to produce a series of audible tones providing a musical effect:

time reference means having an output terminal, for generating and presenting at said output terminal thereof a first electrical signal having the character of a seriies of pulses occurring at a first repetition rate;

gating means having a switchable electrical path therethrough and a control input terminal electrically coupled with said output terminal of said time reference means, for rendering said switchable path electrically conductive in response to said first electrical signal at intervals corresponding in predetermined manner with said first repetition rate;

variable electrical level reference means having an output terminal, for generating and presenting at said output terminal thereof a second electrical signal having the character of a series of sawtooth waves occurring at a second repetition rate and each having an instantaneous level varying as a function of time;

memory means having an output terminal and an input terminal electrically coupled with said output terminal of said level reference means through said switchable path of said gating means, for storing the instantaneous level of said second electrical signal whenever said switchable path is electrically conductive and for presenting at said output terminal thereof a third electrical signal having the character of a stepped-level wave in which the successive steps are initiated at intervals corresponding in predetermined manner with said first repetition rate and are of levels corresponding in predetermined manner with the instantaneous level of said second electrical signal that was last previously stored by said memory means, said memory means including a capacitance having a pair of terminals of which one is electrically coupled with said input terminal of said memory means and the other is electrically grounded, said memory means further including a signal follower unit electrically coupled in series between said input terminal and said output terminal of said memory means;

tone signal producing means having an output terminal and an input terminal electrically coupled with said output terminal of said memory means, for generating and presenting at said output terminal thereof a fourth electrical signal having the character of a series of tone-representing, audio frequency waveforms occurring in time concurrence with the steps of said third electrical signal and of frequency corresponding in predetermined manner with the concurrent level of said third electrical signal; and means for selectively electrically coupling one terminal of electrical resistance means having the other terminal thereof electrically grounded with said input terminal of said memory means in parallel with said capacitance, whereby to provide an immediate rising pitch drift effect in the characteristics of said waveforms of said fourth electrical signal.

15. In apparatus for generating an audio frequency electrical signal adapted for transduction to produce a series of audible tones providing a musical effect:

time reference means having an output terminal, for generating and presenting at said output terminal thereof a first electrical signal having the character of a series of pulses occurring at a first repetition rate;

gating means having a switchable electrical path therethrough and a control input terminal electrically coupled with said output terminal of said time reference means, for rendering said switchable path electrically conductive in response to said first electrical signal at intervals corresponding in predetermined manner with said first repetition rate;

variable electrical level reference means having an output terminal, for generating and presenting at said output terminal thereof a second electrical signal having the character of a series of sawtooth waves occurring at a second repetition rate and each having an instantaneous level varying as a function of time;

memory means having an output terminal and an input terminal electrically coupled with said output terminal of said level reference means through said switchable path of said gating means, for storing the instantaneous level of said second electrical signal whenever said switchable path is electrically conductive and for presenting at said output terminal thereof a third electrical signal having the character of a stepped-level wave in which the successive steps are initiated at intervals corresponding in predetermined manner with said first repetition rate and are of levels corresponding in predetermined manner with the instantaneous level of said second electrical signal that was last previously stored by said memory means; and tone signal producing means having an output terminal and an input terminal electrically coupled with said output terminal of said memory means, for generating and presenting at said output terminal thereof a fourth electrical signal having the character of a series of tone-representing, audio frequency waveforms occurring in time concurrence with the steps of said third electrical signal and of frequency corresponding in predetermined manner with the concurrent level of said third electrical signal, said tone signal producing means including current controlled relaxation oscillator means having a common input and output terminal and capacitance means having a terminal thereof electrically coupled with said common terminal, the other terminal of said capacitance means being electrically grounded, said relaxation oscillator being configured to oscillate at a frequency determined as a function of the level of an electrical control current applied to said common terminal thereof, said tone signal producing means further including voltage controlled, current producing means having an input terminal constituting said input terminal of said tone signal producing means and an output terminal electrically coupled with said common terminal of said relaxation oscillator means, said current producing means being configured for delivering to said relaxation oscillator a control current of level varying in response to variation of the potential level of said third electrical signal applied to said input terminal of said current producing means.

16. In the invention of claim 15, wherein said relaxation oscillator means includes:

means for selectively varying the reactive value of said capacitance means, whereby the range of frequencies of said waveforms of said fourth electrical signal produced by any given form of said third electrical signal may be selectively changed.

17. In apparatus for generating an audio frequency electrical signal adapted for transduction to produce a series of audible tones providing a musical effect:

time reference means having an output terminal, for generating and presenting at said output terminal thereof a first electrical signal having the character of a series of pulses occurring at a first repetition rate;

gating means having a switchable electrical path therethrough and a control input terminal electrically coupled with said output terminal of said time reference means, for rendering said switchable path electrically conductive in response to said first electrical signal at intervals corresponding in predetermined manner with said first repetition rate;

variable electrical level reference means having an output terminal, for generating and presenting at said output terminal thereof a second electrical signal having the character of a series of sawtooth waves occurring at a second repetition rate and each having an instantaneous level varying as a function of time;

memory means having an output terminal and an input terminal electrically coupled with said output terminal of said level reference means through said switchable path of said gating means, for storing the instantaneous level of said second electrical signal whenever said switchable path is electrically conductive and for presenting at said output terminal thereof a third electrical signal having the character of a stepped-level wave in which the successive steps are initiated at intervals corresponding in predetermined manner with said first repetition rate and are of levels corresponding in predetermined manner with the instantaneous level of said second electrical signal that was last previously stored by said memory means; tone signal producing means having an output terminal and an input terminal electrically coupled with said output terminal of said memory means, for generating and presenting at said output terminal thereof a fourth electrical signal having the character of a series of tone-representing, audio frequency waveforms occurring in time concurrence with the steps of said third electrical signal and of frequency corresponding in predetermined manner with the concurrent level of said third electrical signal;

a resistance having one end thereof electrically coupled with ground;

a clamping diode electrically coupled in shunt with said resistance;

a capacitance electrically coupled in series between said output terminal of said tone signal producing means and the other end of said resistance;

an output lead having a second diode in series therewith electrically coupled with said other end of said resistance;

means providing a gating signal having the character of a series of pulses occurring at said first repetition rate;

an electronic gate having a switchable path therethrough and a control input terminal selectively electrically connectable with said gate signal providing means, for rendering said switchable path through said gate electrically conductive in response to said gating signal at intervals corresponding in predetermined manner with said first repetition rate; and electrical circuit mens for electrically coupling said switchable path of said gate in shunt with said capacitance, whereby said waveforms of said fourth electrical signal are modified to provide a decaying volume or percussion-like effect.

18. In apparatus for generating an audio frequency electrical signal adapted for transduction to produce a series of audible tones providing a musical effect:

time reference means having an output terminal, for generating and presenting at said output terminal thereof a first electrical signal having the character of a series of pulses occurring at a first repetition rate;

gating means having a suitchable electrical path therethrough and a control input terminal electrically coupled with said output terminal of said time reference means, for rendering said switchable path electrically conductive in response to said first electrical signal at intervals corresponding in predetermined manner with said first repetition rate;

variable electrical level reference means having an output terminal, for generating and presenting at said output terminal thereof a second electrical signal having the character of a series of sawtooth waves occurring at a second repetition rate and each having an instantaneous level varying as a function of time;

memory means having an output terminal and an input terminal electrically coupled with said output terminal of said level reference means through said switchable path of said gating means, for storing the instantaneous level of said second electrical signal whenever said switchable path is electrically conductive and for presenting at said output terminal thereof a third electrical signal having the character of a stepped-level wave in which the successive steps are initiated at intervals corresponding in predetermined manner with said first repetition rate and are of levels corresponding in predetermined manner with the instantaneous level of said second electrical signal that was last previously stored by said memory means;

tone signal producing means having an output terminal and an input terminal electrically coupled with said output terminal of said memory means, for generating and presenting at said output terminal thereof a fourth electrical signal having the character of a series of tone-representing, audio frequency waveforms occurring in time concurrence with the steps of said third electrical signal and of frequency corresponding in predetermined manner with the concurrent level of said third electrical signal; and filter means electrically coupled with said output terminal of said tone signal producing means for selectively applying frequency filtering to said fourth electrical signal to modify the frequency characteristics of said waveforms of the latter in controlled manner, said filter means including a filter ladder having a pair of side portions and a plurality of cross-bar portions, each of said side portions comprising a plurality of diodes electrically coupled in series, each of said cross-bar portions comprising a fixed value capacitance;

input means electrically coupled with said output terminal of sid tone signal producing means for applying an alternating current signal corresponding to said fourth electrical signal to one side portion of said ladder at one end of the latter;

output means electrically coupled with said one side portion of said ladder adjacent the opposite end thereof for deriving an electrical output signal therefrom;

inverting feedback means electrically coupled between said output means and the other side portion of the ladder at said one end of the latter for applying thereto an alternating current signal corresponding to an inverted version of said output signal; and means electrically coupled with said ladder for causing a controllably variable flow of direct current through said diodes.

whereby said ladder functions as a low pass filter having a controllably variable cut-off frequency.

19. The invention of claim 18, wherein said direct current flow causing means includes:

a voltage controlled current source having an input terminal and an output terminal electrically coupled with both said input means and said feedback means; and a voltage adder having a plurality of control voltages applied thereto as an input and an output terminal electrically coupled with said input terminal of said current source.

20. In the invention of claim 18, wherein said feedback means includes:

means for adjusting the level of said alternating current signal applied to said other side portion of said ladder to just below the level which would sustain oscillations in said other side portion and said feedback means, whereby said ladder exhibits a resonance-like emphasizing effect upon signals of frequency adjacent the cut-off frequency of said ladder.

21. In the invention of claim 1, wherein there is provided, in combination with said apparatus:

audio frequency signal amplifying means having output terminal means and an input terminal electrically coupled with said output terminal of said tone signal producing means, and audio frequency electrical-to-sound transducer means electrically coupled with said output terminal means of said signal amplifying means.

22. In a ladder type adjustable cut-off, low pass, electronic filter:

a first plurality of diodes electrically coupled in series to present one side portion of a filter ladder;

a second plurality of diodes electrically coupled in series to present the other side portion of said filter ladder;

a plurality of fixed value capacitances respectively electrically coupled across said ladder between points of interconnection of corresponding adjacent pairs of said diodes in said side portions of said ladder to present the cross-bars of said filter ladder;

means for applying an alternating current signal to be filtered to said one side portion of said filter ladder at one end of the latter;

means for applying an electrically inverted version of said alternating current signal to said other side portion of said filter ladder at said one end of the latter;

means for causing a flow of direct current through both of said side portions of said filter ladder;

means for varying the level of said direct current flow; and means for deriving a filtered output from said filter ladder adjacent the opposite end thereof.

23. In the invention of claim 22, wherein said deriving means includes:

a differential operational amplifier having an output terminal, an inverting input terminal electrically coupled with said one side portion of said filter ladder, and a non-inverting input terminal electrically coupled with said other side of said filter ladder.

24. In the invention of claim 23, wherein said output terminal of said differential amplifier is electrically coupled with said inverted version applying means.

25. In the invention of claim 22, wherein said direct current flow causing means includes:

a voltage controlled, current source having its output electrically coupled with both of said side portions of said filter ladder.

26. In apparatus for generating an audio frequency electrical signal adapted for transduction to produce a series of audible tones providing a musical effect:

first voltage controlled current generator means having a pair of selectively activatable control input terminals, and an output terminal;

means for providing a first control voltage of adjustable level having an output terminal electrically coupled with one of said control input terminals of said first current generator means;

first current controlled oscillator means having a control input terminal electrically coupled with said output terminal of said first current generator means, and an output terminal;

one-shot multivibrator means having a trigger input terminal electrically coupled with said output terminal of said first oscillator means, and an output terminal;

second voltage controlled current generator means having a pair of selectively activatable control input terminals, and an output terminal;

means for providing a second control voltage of adjustable level having an output terminal electrically coupled with one of said control input terminals of said second current generator means;

second current controlled oscillator means having a control input terminal electrically coupled with said output terminal of said second current generator means, and an output terminal;

electrical level memory means having a signal input terminal, and a signal output terminal;

gate means having a gating input terminal electrically coupled with said output terminal of said multivibrator means, and a pair of switched path terminals of which one is electrically coupled with said output terminal of said second oscillator means and the other is electrically coupled with said signal input terminal of said level memory means;

third voltage controlled current generator means having a control signal input terminal electrically coupled with said output terminal of said level memory means, and an output terminal; and third current controlled oscillator means having a control input terminal electrically coupled with said output terminal of said third current generator means, and output means for delivering a tone signal output.

27. The invention of claim 26, wherein is provided:

means for electrically coupling said output terminal of said level memory means with the other of said pair of control input terminals of said first current generator means.

28. The invention of claim 26, wherein is provided:

means for electrically coupling said output terminal of said level memory means with the other of said pair of control input terminals of said second current generator means.

29. The invention of claim 26, wherein is provided:

means for electrically coupling said output terminal of said level memory means with the other of said pair of control input terminals of said first current generator means; and means for electrically coupling said output terminal of said level memory means with the other of said pair of control input terminals of said second current generator means.

* * * * *